United States Patent [19]
Ravi et al.

[11] Patent Number: 5,661,093
[45] Date of Patent: Aug. 26, 1997

[54] METHOD FOR THE STABILIZATION OF HALOGEN-DOPED FILMS THROUGH THE USE OF MULTIPLE SEALING LAYERS

[75] Inventors: Kramadhati V. Ravi, Atherton; Maciek Orczyk, Cupertino, both of Calif.

[73] Assignee: Applied Materials, Inc., Santa Clara, Calif.

[21] Appl. No.: 716,490

[22] Filed: Sep. 12, 1996

[51] Int. Cl.$^6$ .................................................. H01L 21/316
[52] U.S. Cl. ..................... 438/763; 427/255.7; 427/579; 438/784; 438/788
[58] Field of Search .......................... 437/235, 238, 437/240; 427/255.7, 579

[56] References Cited

U.S. PATENT DOCUMENTS

| 5,334,552 | 8/1994 | Homma | 437/195 |
| 5,429,995 | 7/1995 | Nishiyama et al. | 437/238 |

OTHER PUBLICATIONS

Musaka, Kasuyoki "Single Step Gap Filling Technology For Subhalf Micron Metal Spacings on Plasma Enhanced TEOS/ $O^2$ Chemical Vapor Deposition", Extended Abstracts Of The 1993 Int. Conf. On Solid State Devices and Materials, Mukuhari, 1993, pp. 510–512.

Primary Examiner—Charles L. Bowers, Jr.
Assistant Examiner—Matthew Whipple
Attorney, Agent, or Firm—Townsend and Townsend and Crew LLP

[57] ABSTRACT

A method and apparatus for depositing a halogen-doped oxide film having a low dielectric constant that is resistant to moisture absorption and outgassing of the halogen dopant, and that retains these qualities despite subsequent processing steps. The method begins by introducing process gases (including a halogen-containing source gas) into a processing chamber. A halogen-doped layer is then deposited. The combination of process gases is then changed and a sealing layer deposited which seals the dopant into the halogen-doped layer. The sealing layer may, for example, be a carbon-rich layer or an undoped layer. These steps are repeated until the film reaches a selected thickness.

34 Claims, 16 Drawing Sheets

METHOD FOR THE STABILIZATION OF HALOGEN-DOPED FILMS THROUGH THE USE OF MULTIPLE SEALING LAYERS

BACKGROUND OF THE INVENTION

The present invention relates to the deposition of dielectric layers during semiconductor substrate processing. More specifically, the present invention relates to a method and apparatus for forming halogen-doped layers having a low dielectric constant and high film stability. The process of the present invention may also be applied to the formation of silicon oxide, silicon nitride and other types of layers.

One of the primary steps in the fabrication of modern semiconductor devices is the formation of a thin film on a substrate by chemical reaction of gases. Such a deposition process is referred to as chemical vapor deposition (CVD). Thermal CVD processes supply reactive gases to the substrate surface where heat-induced chemical reactions take place to produce a desired film. The high temperatures at which some thermal CVD processes operate can damage metal layers on device structures.

Plasma enhanced CVD (PECVD) processes, on the other hand, promote excitation and/or dissociation of the reactant gases by the application of radio frequency (RF) energy to a reaction zone proximate to the substrate surface, thereby creating a plasma. The high reactivity of the species in the plasma reduces the energy required for a chemical reaction to take place and thus lowers the required temperature for such CVD processes. The relatively low temperature used in CVD processes makes them suitable for the formation of insulating layers over deposited metal or polysilicon layers. A common material used in such insulating layers (also referred to as dielectric layers) is silicon oxide. Silicon oxide films are well suited for use as dielectric layers because of their electrical and physical properties.

Semiconductor device geometries have decreased dramatically in size since such devices were first introduced several decades ago. During that time, integrated circuits have generally followed the two year/half-size rule (often called "Moore's Law"), meaning that the number of devices which will fit on a chip doubles every two years. Today's semiconductor fabrication plants routinely produce devices with feature sizes of 0.5 microns or even 0.35 microns, and tomorrow's plants will be producing devices with even smaller feature sizes.

As feature sizes become smaller, maintaining certain values of film characteristics, such as the dielectric constant of insulating layers, becomes critical. The advent of multi-level metal technology, employing three, four, or more metallic layers, has spurred interest in lowering the dielectric constant of insulating layers such as intermetal dielectric layers (IMD) deposited by PECVD methods. Low dielectric constant films are particularly desirable for IMD layers to reduce the RC time-delay of the interconnect metallization, to prevent cross-talk between the different levels of metallization, and to reduce device power consumption.

Many approaches to obtain lower dielectric constants have been proposed. One of the more promising solutions is the incorporation of fluorine or, other halogen elements, such as chlorine or bromine into a silicon oxide layer. An example of halogen incorporation is described in U.S. Ser. No. 08/344,283, now abandoned commonly assigned to Applied Materials, Inc. filed on Nov. 24, 1994 and incorporated herein by reference. Fluorine, the preferred halogen dopant for silicon oxide films, lowers the dielectric constant of the silicon oxide film because fluorine is an electronegative atom that decreases the polarizability of the overall SiOF network. Fluorine-doped silicon oxide films are also referred to as fluoro-silicate glass (FSG) films.

In addition to decreasing the dielectric constant, incorporating fluorine in intermetal silicon oxide layers also helps solve common problems encountered in fabricating smaller geometry devices, such as filling closely spaced gaps in semiconductor structures. Because fluorine is an etching species, it is believed that fluorine doping introduces an etching effect on the growing film. This simultaneous deposition/etching effect allows FSG films to have improved gap filling capabilities such that the films are able to adequately cover adjacent metal layers having an aspect ratio of 1.8 or more.

Thus, manufacturers desire to include fluorine in various dielectric layers and particularly in intermetal dielectric layers. A problem with the incorporation of fluorine in silicon oxide or similar films, however, has been keeping the fluorine in the film. Experiments have shown only a certain level of fluorine is retained in a silicon oxide layer, even when the gas flow of the fluorine containing source gas is increased during the CVD process.

At least two separate forces affect the fluorine retention rate. The first is that FSG films absorb moisture easily. Clean room ambients may include airborne moisture, as may some processing steps performed during substrate processing. When a substrate is exposed to the ambient in a clean room, for example, during transfer to a new processing chamber after oxide layer deposition, the FSG layer may absorb moisture, thereby increasing the film's dielectric constant. Absorbed moisture ($H_2O$) reacts with the fluorine to form hydrofluoric acid (HF), which attacks the metal films often used as device interconnects in such microelectronic circuits.

Another difficulty encountered with FSG films occurs when the film is exposed to a thermal process such as an anneal process. The high temperature of the thermal processes can move the fluorine atoms out of the oxide layer through metal or other subsequently deposited layers. The excursion of fluorine atoms in this manner is referred to as "outgassing."

Sealing layers have been shown to stabilize halogen-doped films. A sealing layer may consist of a material such as a silicate glass (e.g., undoped silicate glass (USG)). This type of sealing layer is disclosed, for example, in U.S. patent application Ser. No. 08/548,391 entitled "Method and Apparatus for Improving Film Stability of Halogen-Doped Silicon Oxide Films," by P. Lee, S. Robles, A. Gupta, V. S. Rana and A. Verma, filed Oct. 26, 1995, the disclosure of which is incorporated herein by reference. These sealing layers are generally effective in preventing the absorption of water and the outgassing of fluorine during subsequent processing steps.

However, such films may not be ideal for all applications. Certain processing steps used in some fabrication sequences may compromise the characteristics of such films. For example, chemical-mechanical polishing (CMP) operations are sometimes performed on intermediary layers (e.g., IMD layers) in preparation for the deposition of overlying layers. CMP is performed to provide a smooth, flat surface on which these subsequent layers may be formed. In doing so, the CMP step erodes the film being polished. Thus, CMP operations may remove all or part-of the sealing layer. Also, regions of a fluorine-doped film may be exposed when the film is etched to allow layer(s) above the film to contact layer(s) below the film. This occurs, for example, when a via is etched leaving the via's sidewalls are exposed until covered during subsequent processing. Fluorine outgassing and moisture absorption can occur through the exposed sidewalls.

From the above, it can be seen that an oxide film having a low dielectric constant is necessary to keep pace with emerging technologies. Furthermore, it can be seen that improved methods of preventing or reducing moisture absorption and outgassing in fluorine-doped oxide films are desirable.

SUMMARY OF THE INVENTION

The present invention solves the above problems of the prior art by providing a method and apparatus for depositing an oxide film having a low dielectric constant which resists moisture absorption and outgassing of the halogen dopant, and which retains these qualities despite subsequent processing steps.

According to the method of the present invention, a multi-layered halogen-doped film is deposited on a substrate. The process begins by introducing a process gas that includes silicon, oxygen and a halogen element (e.g., fluorine) into a processing chamber to deposit a halogen-doped silicon oxide layer. The process gas is then altered by the introduction or removal of elements to deposit a sealing layer. This sealing layer reduces the migration of the halogen element out of the halogen-doped silicon oxide layer. These steps are repeated until the film reaches a selected thickness.

The sealing layer may be formed, for example, by creating a carbon-rich layer. In one embodiment, a carbon-containing gas (e.g., methane) is part of the process gas used to deposit the halogen-doped silicon oxide layer. The carbon-rich layer is deposited by reducing or removing the silicon and oxygen in the process gas after deposition of the halogen-doped silicon oxide layer. In another embodiment, a carbon-rich sealing layer is deposited by introducing carbon into the process gas when the sealing layer is to be deposited. At about the same time, the silicon and oxygen can also be removed from the process gas while retaining or increasing the rate at which the carbon-containing gas is introduced.

In yet another embodiment, the sealing layer is formed by depositing a layer having little or no halogen dopant (also termed an undoped layer). The undoped layer may be deposited by temporarily stopping the introduction of a halogen-containing source gas into the process gas.

A further understanding of the nature and advantages of the present invention may be realized by reference to the remaining portions of the specification and the drawings.

DETAILED DESCRIPTION OF THE PREFERRED EMBODIMENTS

I. An Exemplary HDP-CVD System

Figure 1A:
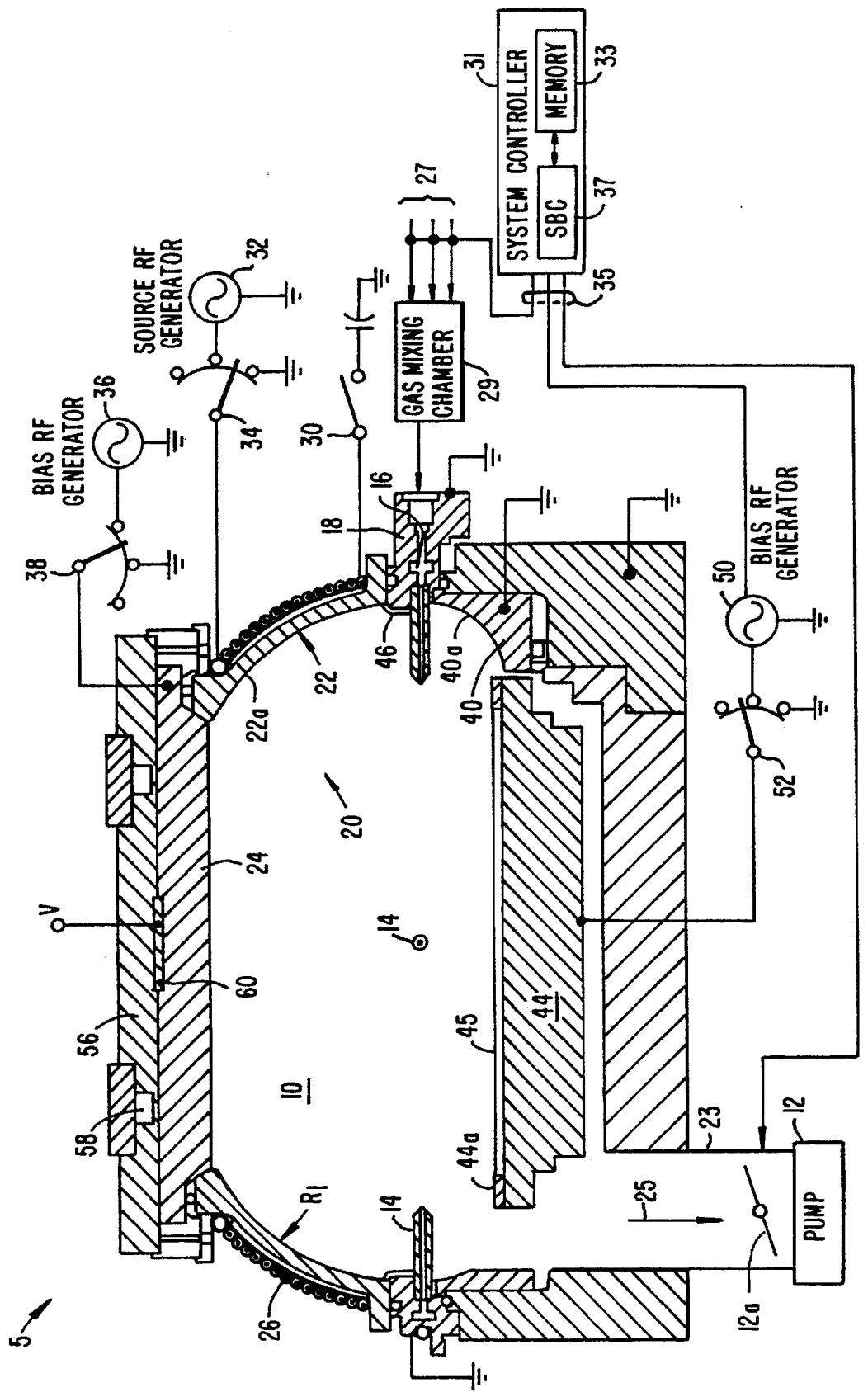
FIG. 1A is a vertical, cross-sectional view of one embodiment of a exemplary high-density plasma CVD (HDP-CVD) apparatus in which a film according to the present invention.

FIG. 1A illustrates one embodiment of a HDP CVD system 5 in which the dielectric layer according to the present invention can be deposited. HDP CVD system 5 includes a vacuum chamber 10, a vacuum pump 12, a bias RF (BRF) generator 36, a BRF generator 50 and a source RF (SRF) generator 32.

Vacuum chamber 10 includes a ceiling 12 consisting of a sidewall 22 and a disk-shaped ceiling electrode 24. Sidewall 22 is made of an insulator such as quartz or ceramic and supports coiled antenna 26. The structural details of coiled antenna 26 are disclosed in U.S. patent application Ser. No. 08/113,776 entitled "High Density Plasma CVD and Etching Reactor," by Fairbain and Nowak, filed Aug. 27, 1993, the disclosure of which is incorporated herein by reference.

Deposition gases and liquids are supplied through lines 27, having control valves not shown, into a gas mixing chamber 29 where they are combined and sent to gas supply ring manifold 16. Generally, each gas supply line for each process gas includes (i) safety shut-off valves (not shown) that can be used to automatically or manually shut off the flow of process gas into the chamber, and (ii) mass flow controllers (MFCs) (also not shown) that measure the flow of gas through the gas supply lines. When toxic gases are used in the process, the several safety shut-off valves are positioned on each gas supply line in conventional configurations.

Gas injection nozzles 14 are coupled to gas supply ring manifold 16 and disperse deposition gases introduced into manifold 16 to a substrate 45 resting on a pedestal 44 within chamber 10. Pedestal 44 may be moved up and down by a motor (not shown) into various processing positions. Additionally, pedestal 44 may contain an electrostatic chuck or similar mechanism to restrain the wafer during processing and may also contain cooling passages and other features.

Gas supply ring manifold 16 is positioned within a housing 18. Housing 18 is protected from reagents by a skirt 46. Skirt 46 is composed of a substance, such as quartz, ceramic, silicon or polysilicon, which is resistant to the reagents used in the HDP CVD process. The bottom of vacuum chamber 10 may include an annular liner 40, which itself may be made removable.

An inductively coupled plasma of the deposition gases can be formed adjacent to substrate 45 by RF energy applied to coiled antenna 26 from source RF generator 32. Source RF generator 32 can supply either single or mixed frequency RF power (or other desired variation) to coiled antenna 26 to enhance the decomposition of reactive species introduced into vacuum chamber 10. A plasma formed in such a manner has a relatively high density (on the order of $10^{11}$ to $10^{12}$ ions/cm$^3$) as compared with standard PECVD reactors. Deposition gases are exhausted from chamber 10 through exhaust line 23 as indicated by arrow 25. The rate at which gases are released through exhaust line 23 is controlled by throttle valve 12a.

Ceiling electrode 24 is held in place by a lid 56. Lid 56 is cooled by cooling jackets 58, but ceiling electrode 24 can be heated by a resistive heater 60 to accelerate cleaning rates or alter process parameters. Ceiling electrode 24 is a conductor and may be connected to either ground, to a BRF generator 36, or left unconnected (allowed to float), by properly setting switch 38. Similarly, pedestal 44 may be connected to either ground, to a BRF generator 50 or left unconnected (allowed to float), by properly setting switch 52. The settings of these switches depends upon the plasma's desired characteristics. BRF generators 36 and 50 can supply either single or mixed frequency RF power (or other desired variation). BRF generators 36 and 50 may be separate RF generators, or may be a single RF generator connected to both ceiling electrode 24 and pedestal 44. Application of RF energy from BRF generators 36 and 50 to bias an inductively coupled plasma toward pedestal 44 promotes sputtering and enhances existing sputtering effects of the plasma (i.e., increasing the gap-fill capability of a film). Capacitive coupling may also be used to form the plasma. Such a plasma may be formed between ceiling electrode 24 and pedestal 44 or in a similar fashion.

BRF generators 36 and 50, SRF generator 32, throttle valve 12a, the MFCs connected to lines 27, switches 30, 34, 38 and 52, and other elements in CVD system 5 are all controlled by a system controller 31 over control lines 35, only some of which are shown. System controller 31 operates under the control of a computer program stored in a computer-readable medium such as a memory 33, which, in the preferred embodiment is a hard disk drive. The computer program dictates the timing, introduction rate and mixture of gases, chamber pressure, chamber temperature, RF power levels and other parameters of a particular process. Motors and optical sensors are used to move and determine the position of movable mechanical assemblies such as throttle valve 12a and pedestal 44.

System controller 31 controls all of the activities of the CVD machine. In a preferred embodiment, controller 31 includes a hard disk drive (memory 33), a floppy disk drive, and a card rack. The card rack contains a single board computer (SBC) 37, analog and digital input/output boards, interface boards and stepper motor controller boards (only some of which are shown). The system controller conforms to the Versa Modular Europeans (VME) standard which defines board, card cage, and connector dimensions and types. The VME also defines the bus structure having a 16-bit data bus and 24-bit address bus.

Figure 1B:
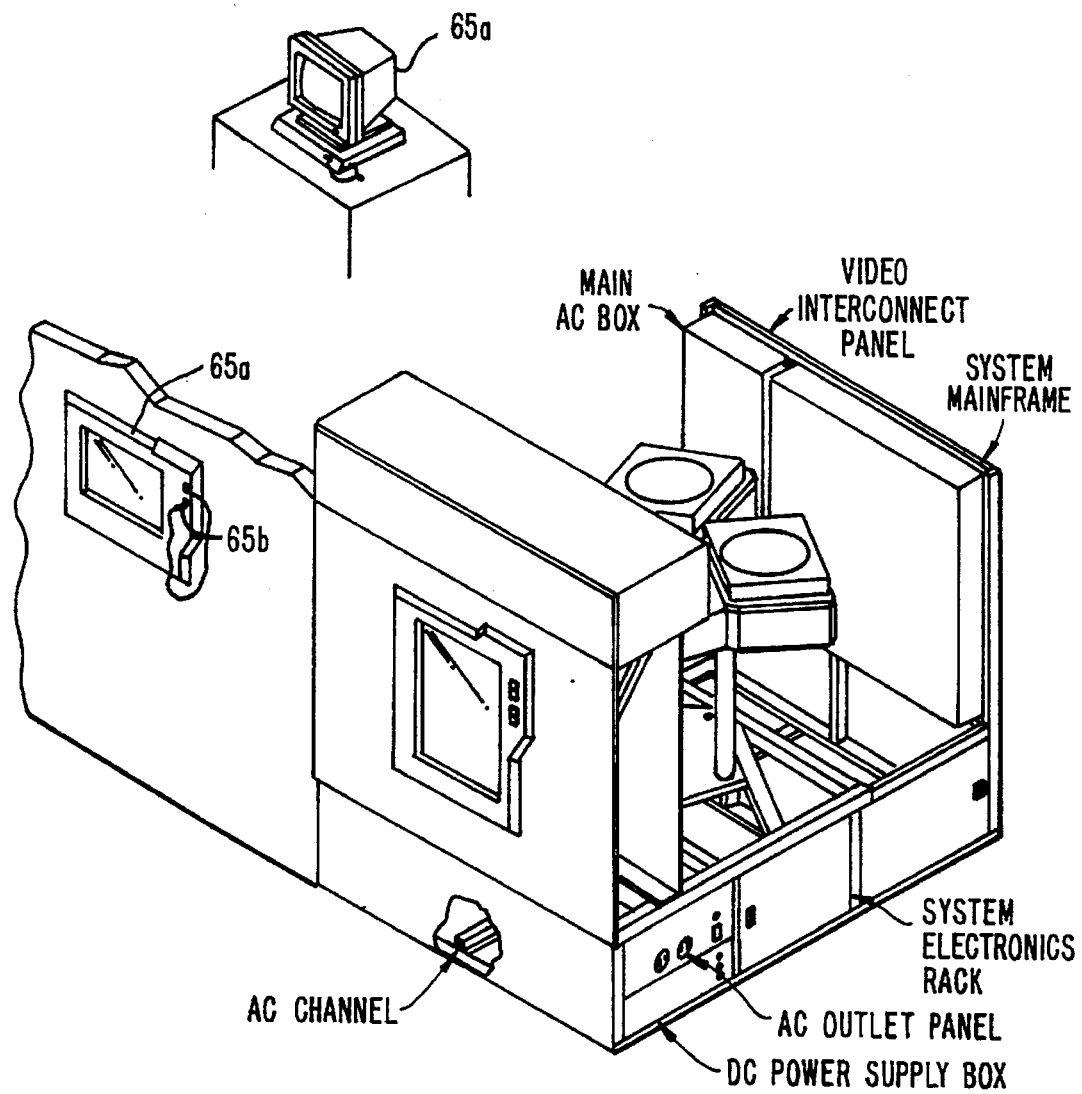
FIG. 1B is a diagram of an exemplary system monitor used in conjunction with the exemplary CVD processing chamber of FIG. 1A.

System controller 31 operates under the control of a computer program stored on the hard disk drive. The computer program dictates the timing, mixture of gases, RF power levels and other parameters of a particular process. The interface between a user and the system controller is via a CRT monitor 65a and a lightpen 65b which is depicted in FIG. 1B. In the preferred embodiment two monitors 65a are used, one mounted in the clean room wall for the operators and the other behind the wall for the service technicians. Both monitors 65a simultaneously display the same information, but only one lightpen 65b is enabled. Lightpen 65b detects light emitted by CRT display with a light sensor in the tip of the pen. To select a particular screen or function, the operator touches a designated area of the display screen and pushes the button on pen 65b. The touched area changes its highlighted color, or a new menu or screen is displayed, confirming communication between the lightpen and the display screen.

The process can be implemented using a computer program product that runs on, for example, system controller 31. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 1C:
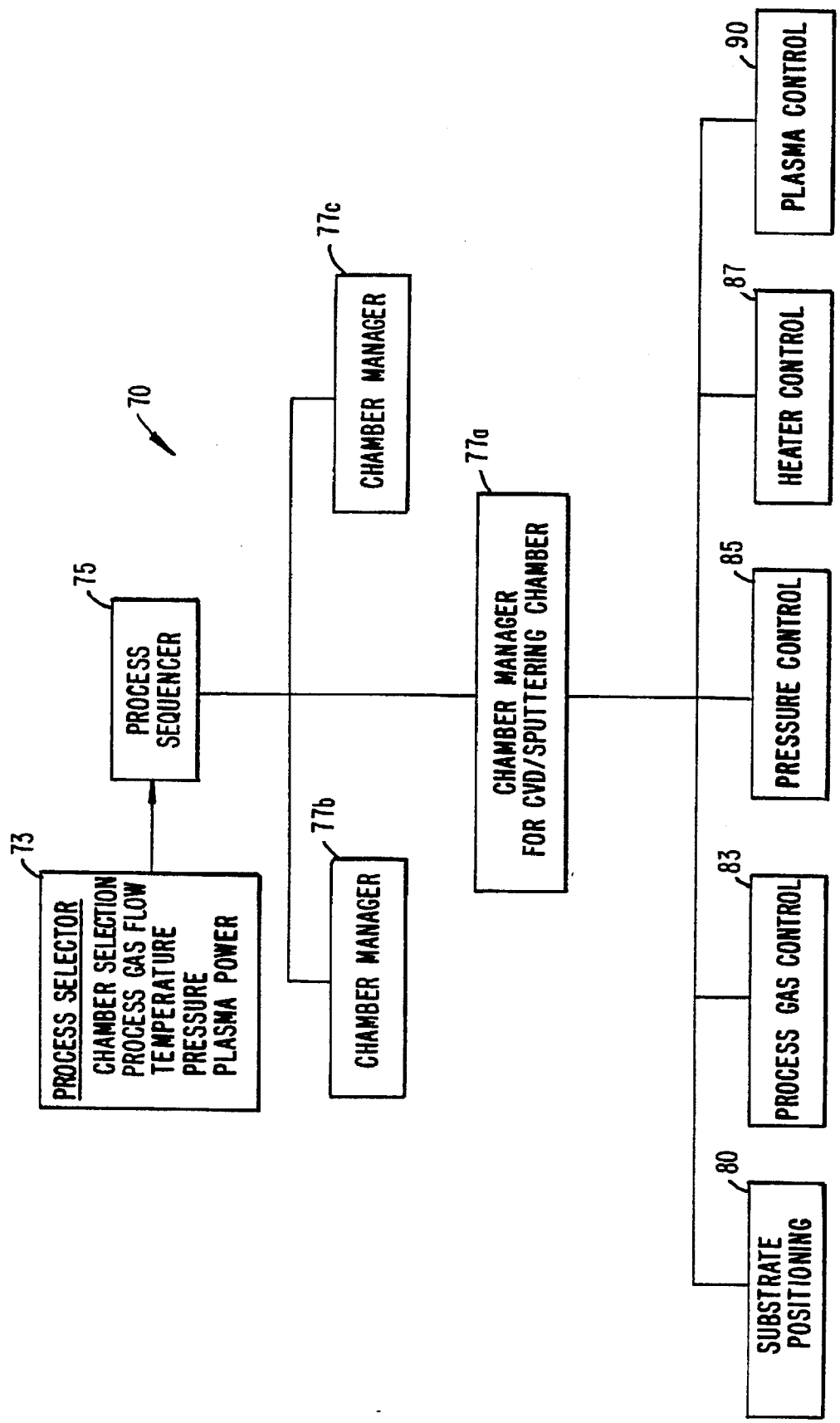
FIG. 1C is a flow chart of an exemplary process control computer program product used to control the CVD processing chamber of FIG. 1A.

FIG. 1C shows an illustrative block diagram of the hierarchical control structure of computer program 70. A user enters a process set number and process chamber number into a process selector subroutine 73 in response to menus or screens displayed on the CRT monitor by using the lightpen interface. The process sets are predetermined sets of process parameters necessary to carry out specified processes, and are identified by predefined set numbers. The process selector subroutine 73 identifies (i) the desired process chamber in a multichamber system, and (ii) the desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the lightpen/CRT monitor interface.

The signals for monitoring the process are provided by the analog input and digital input boards of system controller and the signals for controlling the process are output on the analog output and digital output boards of system controller 31.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so sequencer subroutine 75 operates to schedule the selected processes in the desired sequence. Preferably, sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 can be designed to take into consideration the present condition of the process chamber being used in comparison with the desired process conditions for a selected process, or the "age" of each particular user entered request, or any other relevant factor a system programmer desires to include for determining scheduling priorities.

After sequencer subroutine 75 determines which process chamber and process set combination is going to be executed next, sequencer subroutine 75 causes execution of the process set by passing the particular process set parameters to a chamber manager subroutine 77a–c which controls multiple processing tasks in process chamber 10 according to the process set determined by sequencer subroutine 75. For example, chamber manager subroutine 77a comprises program code for controlling sputtering and CVD process operations in process chamber 10. Chamber manager subroutine 1440 also controls execution of various chamber component subroutines which control operation of the chamber components necessary to carry out the selected process set.

Examples of chamber component subroutines are substrate positioning subroutine 80, process gas control subroutine 83, pressure control subroutine 85, heater control subroutine 87, and plasma control subroutine 90. Those having ordinary skill in the art will recognize that other chamber control subroutines can be included depending on what processes are desired to be performed in process chamber 10. In operation, chamber manager subroutine 77a selectively schedules or calls the process component subroutines in accordance with the particular process set being executed. Scheduling by chamber manager subroutine 77a is performed in a manner similar to that used by sequencer subroutine 75 in scheduling which process chamber 10 and process set is to be executed. Typically, chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1C. Substrate positioning subroutine 80 comprises program code for controlling chamber components that are used to load a substrate onto pedestal 44 and to move the pedestal to a processing position. Substrate positioning subroutine 80 may also control transfer of a substrate into chamber 10 from, e.g., a PECVD reactor after other processing has been completed.

Process gas control subroutine 83 has program code for controlling process gas composition and flow rates. Subroutine 83 controls the open/close position of the safety shut-off valves, and also ramps up/down the mass flow controllers to obtain the desired gas flow rate. All chamber component subroutines, including process gas control subroutine 83, are invoked by chamber manager subroutine 77a. Subroutine 83 receives process parameters from the chamber manager subroutine related to the desired gas flow rates. Typically, process gas control subroutine 83 operates by opening the gas supply lines, and repeatedly (i) reading the necessary mass flow controllers, (ii) comparing the readings to the desired flow rates received from chamber manager subroutine 77a, and (iii) adjusting the flow rates of the gas supply lines as necessary. Furthermore, process gas control subroutine 83 includes steps for monitoring the gas flow rates for unsafe rates, and activating the safety shut-off valves when an unsafe condition is detected.

In some processes, an inert gas such as argon is flowed into chamber 10 to stabilize the pressure in the chamber before reactive process gases are introduced into the chamber. For these processes, the process gas control subroutine 83 is programmed to include steps for flowing the inert gas into chamber 10 for an amount of time necessary to stabilize the pressure in the chamber. The above-described steps may then be carried out. Additionally, when a process gas is to be vaporized from a liquid precursor, for example tetraethylorthosilane (TEOS), the process gas control subroutine 83 includes steps for bubbling a delivery gas such as helium through the liquid precursor in a bubbler assembly or for introducing the helium to a liquid injection valve. For this type of process, the process gas control subroutine 83 regulates the flow of the delivery gas, the pressure in the bubbler, and the bubbler temperature to obtain the desired process gas flow rates. As discussed above, the desired process gas flow rates are transferred to process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

Pressure control subroutine 85 includes program code for controlling the pressure in chamber 10 by regulating the size of the opening of throttle valve 12a in the exhaust portion of the chamber. The size of the opening of throttle valve 12a is set to control the chamber pressure to the desired level in relation to the total process gas flow, size of the process chamber, and pumping setpoint pressure for the exhaust system. When pressure control subroutine 85 is invoked, the desired, or target, pressure level is received as a parameter from chamber manager subroutine 77a. Pressure control subroutine 147 operates to measure the pressure in chamber 10 by reading one or more conventional pressure nanometers connected to the chamber, compare the measure value (s) to the target pressure, obtain proportional, integral, and differential (PID) values from a stored pressure table corresponding to the target pressure, and adjust the throttle valve 12a according to the PID values obtained from the pressure table. Alternatively, pressure control subroutine 85 can be written to open or close throttle valve 12a to a particular opening size to regulate chamber 10 to attain a desired pressure.

Heater control subroutine 87 comprises program code for controlling the temperature of chamber 10. Heater control subroutine 87 is also invoked by chamber manager subroutine 77a and receives a target, or setpoint, temperature parameter. Heater control subroutine 87 measures the temperature by measuring voltage output of a thermocouple located in pedestal 44, compares the measured temperature to the setpoint temperature, and increases or decreases current applied to the resistive heating element 60 (or to BRF generators 30, 50 as needed) to obtain the setpoint temperature. The temperature is obtained from the measured voltage by looking up the corresponding temperature in a stored conversion table, or by calculating the temperature using a fourth order polynomial.

Plasma control subroutine 90 comprises program code for setting the RF voltage power level applied to RF generators 32, 36 and 50 in chamber 10, and optionally, to set the level of the magnetic field generated in the chamber. The plasma control subroutine 90, like the previously described chamber component subroutines, is invoked by chamber manager subroutine 77a.

An example of such an HDP CVD apparatus along with the advantages of each of the three capacitively coupled configurations and the specific details concerning the inductively coupled configurations is described in U.S. patent application Ser. No. 08/234,746 entitled "High Density Plasma CVD Reactor with Combined Inductive and Capacitive Coupling," by Nowak, Fairbairn and Redeker, filed Apr. 26, 1994, the disclosure of which is incorporated herein by reference.

The above description is for illustrative purposes only and should not be considered as limiting the scope of the present invention. Variations of the above described system, such as variations in pedestal design, chamber design, location of RF power connections and other variations are possible. Additionally, other CVD equipment such as electron cyclotron resonance (ECR) plasma CVD devices, thermal CVD devices or the like, may be employed. The method and apparatus of the present invention are not limited to any specific apparatus or to any specific plasma excitation method.

II. Stabilization of Halogen-Doped Films through the Use of Multiple Sealing Layers Using a substrate processing apparatus such as the exemplary HDP-CVD system described above, a film is deposited according to the present invention by repeatedly depositing a bulk layer followed by a sealing layer. The product is a multi-layer, halogen-doped film, resistant to the absorption of water and to the loss of halogen dopant by outgassing. The film retains these qualities throughout subsequent processing.

Figure 2A:
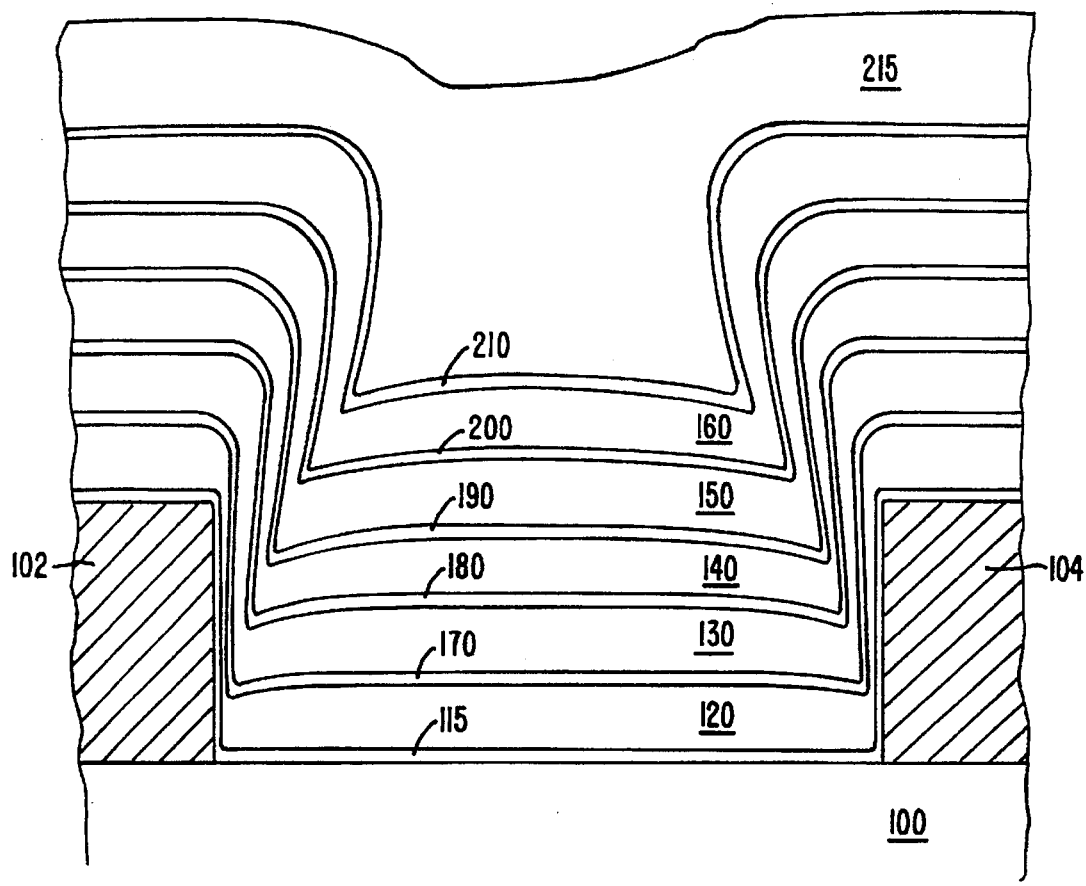
FIG. 2A is a simplified cross-sectional view of a multi-layered halogen-doped silicon oxide film deposited on a substrate according to the present invention.

A simplified structure according to the method of the present invention is illustrated in FIG. 2A. In FIG. 2A, a sealed halogen-doped film 110 is deposited over a substrate 100 and metal lines 102 and 104. Sealed halogen-doped film 110 is a multi-layered film that includes two or more pairs of layers. Each layer pair is made up of a bulk layer (bulk layers 120–160 in FIG. 2A) and a sealing layer (sealing layers 170–210 in FIG. 2A). Each bulk layer 120–160 is a silicon oxide film, doped with a halogen (e.g., fluorine). Sealing layers 170–210 may be, for example, undoped films silicon oxide or carbon-rich layers. Sealing layers 170–210 do not exhibit the moisture absorption tendencies that halogen-doped bulk layers 120–160 exhibit. Instead, sealing layers 170–210 act as a barrier to outside moisture and help prevent the halogen riopant from outgassing from bulk layers 120–160 during subsequent processing. A planarization layer 215 may be deposited over layer 110 in some applications to further planarize the dielectric layer.

A structure of the type illustrated in FIG. 2A offers several advantages. As noted, some halogen or fluorine-doped films are relatively unstable in the presence of moisture. Elevated temperatures can also alter the properties of such films (e.g., because of outgassing). The multiple sealing layers of the present invention provide multiple barriers to halogen diffusion from the bulk layers. Subsequent annealing or other processing is therefore less likely to cause outgassing of the halogen dopant.

The sealing layers also act as a barrier to ambient moisture, further stabilizing the halogen dopant contained in the bulk layers. This avoids the higher dielectric constants caused by water absorption and reduces the possibility of absorbed moisture combining with the halogen dopant (e.g., fluorine) to form acids (e.g., hydrofluoric acid), which may attack metal interconnect structures. The protection of metal interconnect layers is particularly important in IMD layers, as such layers are in contact with metal interconnect and are sometimes followed by a chemical-mechanical polishing (CMP) or other type of etchback step. In a CMP process, a slurry is applied to the surface of the layers deposited on the substrate to prepare the surface for the deposition of subsequent layers. Among other constituents, CMP slurries contain water, with the attendant detrimental effects previously noted. The present invention helps prevent the water used in such processes from interfering with the halogen-doped film's desirable qualities.

The carbon-rich sealing layer described herein may also be deposited as a lining layer prior to depositing the initial halogen-doped silicon oxide layer. Such a lining layer reduces outgassing into the material underlying the initial halogen-doped silicon oxide layer (e.g., metal interconnect or the substrate and is illustrated in FIG. 2A as layer 115). Lining layer 115 is substantially identical in composition to a sealing layer, and may be deposited using any of the methods for depositing a sealing layer described herein.

Figure 2B:
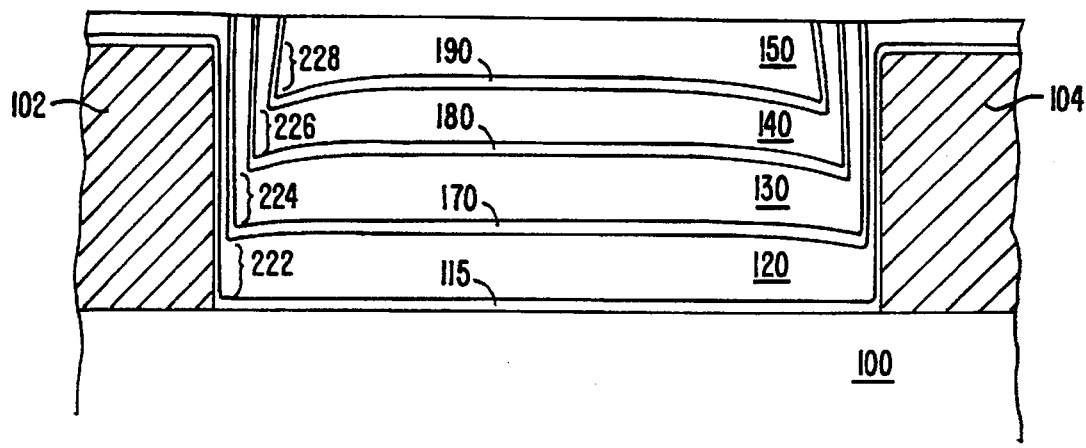
FIG. 2B is the film of FIG. 2A after chemical mechanical polishing.

A multi-layered film of the present invention is readily integrated into a fabrication process. As previously described, certain deposited films are polished or etched during the fabrication process to provide a flat, defect-free surface for subsequent layers. As this is done, the film is eroded. In a film deposited according to the present invention, a sealing layer will always be at or just below the polished surface, thus protecting the halogen-doped bulk layers below. The effects of such processing are illustrated in FIG. 2B, which shows sealed halogen-doped film 110 after CMP processing. Also, bulk layer 160 and sealing layers 200 and 210 have been completely worn away by the polishing operation. Bulk layer 150 has been partially worn away. As shown in FIG. 2B, however, sealing layers 170, 180 and 190 are not effected by the CMP step and provide protection against or moisture absorption to underlying bulk layer 120, 130 and 140.

Lateral outgassing may also occur in halogen-doped films in an area such as the portion of film 110 that fills the gap between metal lines 102 and 104. This occurs when halogen dopant outgasses into surrounding material at a vertical junction between a halogen-doped film and the surrounding material (e.g., boundaries 222, 224, 226 and 228 in FIG. 2B). A further object of the present invention is thus to reduce such lateral outgassing. This reduction in lateral outgassing is illustrated by a comparison of FIGS. 3A and 3B.

Figure 3A:
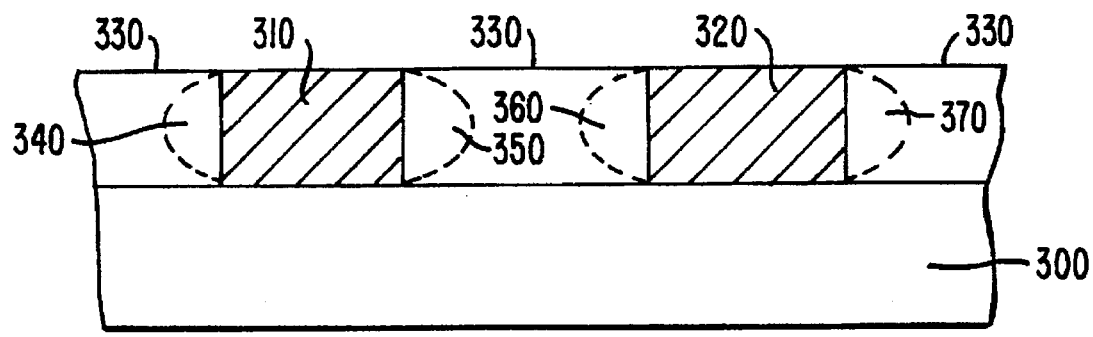
FIG. 3A is a simplified cross-sectional view of a halogen-doped silicon oxide film deposited in a gap showing the outgassing profiles of halogen dopants into the surrounding material.

FIG. 3A shows the doping profile indicating where outgassing may occur in a halogen-doped film deposited in the traditional manner (i.e., as a single, halogen-doped layer). A metal layer is deposited on substrate 300 (represented by metal lines 310 and 320). A halogen-doped film 330 is subsequently deposited as an IMD. Large areas of halogen-doped film 330 (indicated by doping contours 340, 350, 360 and 370) will likely be subject to outgassing due to the large area of contact between halogen-doped film 330 and metal lines 310 and 320. This outgassing may cause the film's dielectric constant to increase markedly because a relatively large portion of halogen-doped film 330 effectively reverts to an undoped state when the halogen atoms migrate into metal lines 310 and 320.

Figure 3B:
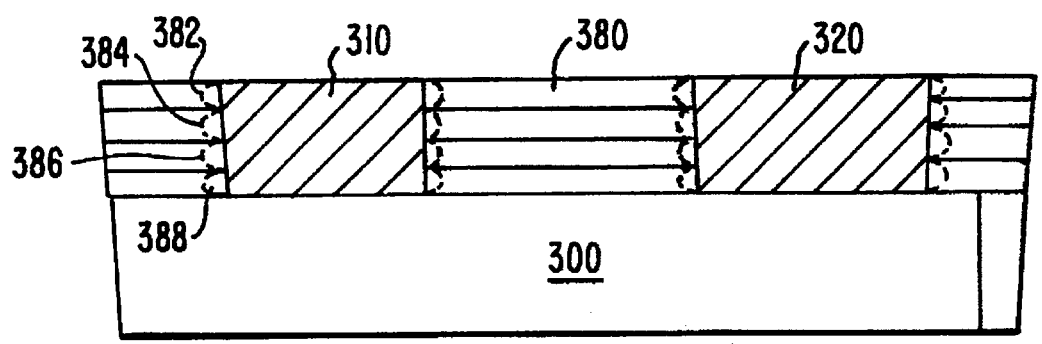
FIG. 3B is a simplified cross-sectional view of a multi-layered halogen-doped silicon oxide film deposited in a gap according to the present invention showing the outgassing profiles of halogen dopants into the surrounding material.

FIG. 3B shows a doping profile of a sealed halogen-doped film 380, which has been deposited according to the present invention. FIG. 3B is simplified in that it does not accurately depict the thin deposition of each sealing and bulk layer along the sidewalls of metal lines 310 and 320 that is shown in FIGS. 2A and 2B. Such an omission helps illustrate the concept of the present invention. Also, while the exact effect of the thin sealing layers deposited on the sidewalls of metal lines has not been conclusively determined, if anything these layers serve to further reduce outgassing into the metal lines since they provide a barrier between the lines and the film deposited in the gap between the lines.

FIG. 3B illustrates that less outgassing occurs as more sealing layers (and so layer pairs) are created. As the height of the area in contact with the surrounding material decreases, the volume subject to outgassing decreases. For example, the combined area of doping contours 382, 384, 386 and 388 is visibly less than that of doping contour 340 in FIG. 3A. Thus, the dielectric constant of sealed halogen-doped film 380 will remain closer to the intended value than that of a single-layer film. This is true, however, only within limits. As the number of layers increases, the proportion of carbon (or undoped material) in the resultant film also increases. This is because, while the thickness of each sealing layer remains constant, the thickness of each bulk layer is reduced. At the extreme, the film consists largely of carbon (or undoped material) and ceases to have certain of the original film's properties. Thus, a preferred range of thicknesses for the bulk layers exists, which depends upon the desired physical and electrical characteristics of the film.

Figure 4A:
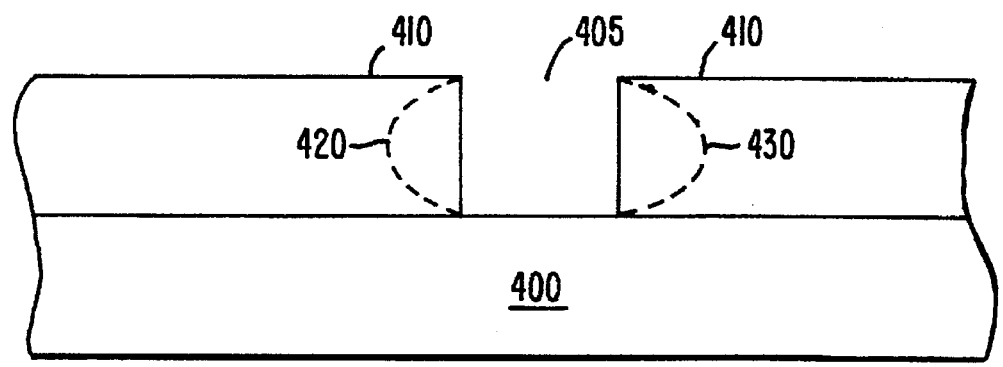
FIG. 4A is a simplified cross-sectional view of a halogen-doped silicon oxide film deposited on a substrate showing the outgassing profiles of halogen dopants at the site of a via.
Figure 4B:
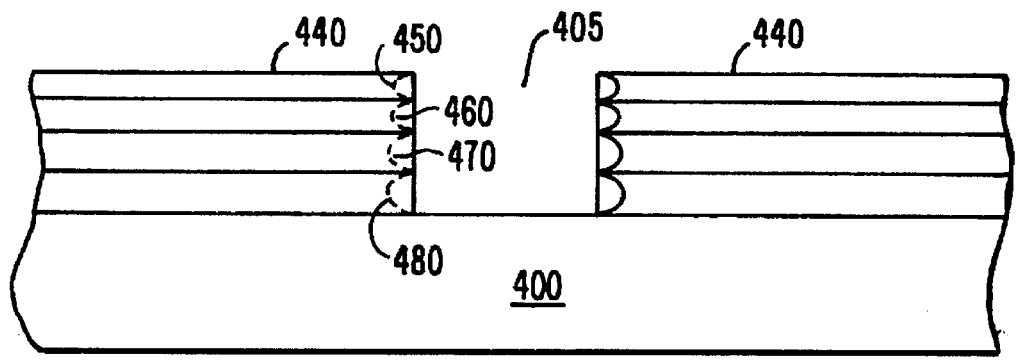
FIG. 4B is a simplified cross-sectional view of a multi-layered halogen-doped silicon oxide film deposited on a substrate according to the present invention showing the outgassing profiles of halogen dopants at the site of a via.

When etched into halogen-doped films, the sidewalls of vias (which allow metal-to-metal connections) and contacts (which allow metal-to-silicon connections) may also experience lateral outgassing. A doping profile of such a structure is shown in FIG. 4A, which illustrates the extent to which outgassing may occur for large sidewall areas. For example, a via 405 may be etched into halogen-doped film 410 deposited on a substrate 400. Large areas of halogen-doped film 410 (indicated by doping contours 420 and 430) may be subject to outgassing due to the size of the area exposed. FIG. 4B illustrates that less outgassing occurs as more sealing layers are employed. Use of multiple layers reduces the large sidewall surface at which outgassing may be experienced to several smaller surfaces. As can be seen in FIGS. 4A and 4B, the area enclosed by doping contour 420 is visibly larger than the combined areas of doping contours 450, 460, 470 and 480. Because the vertical walls of such structures may be exposed to the clean room ambient, moisture absorption is again a concern. Here, too, smaller surface areas allow less absorption to occur.

It is also believed that this "alternating chemistry" process may enable an increase in the net deposition rate. This increase is thought to be due to the new nucleation surface periodically created on which the next layer may be deposited. With a fresh set of nucleation sites, the next layer may begin deposition more easily than on a perfectly crystalline surface.

Figure 5:
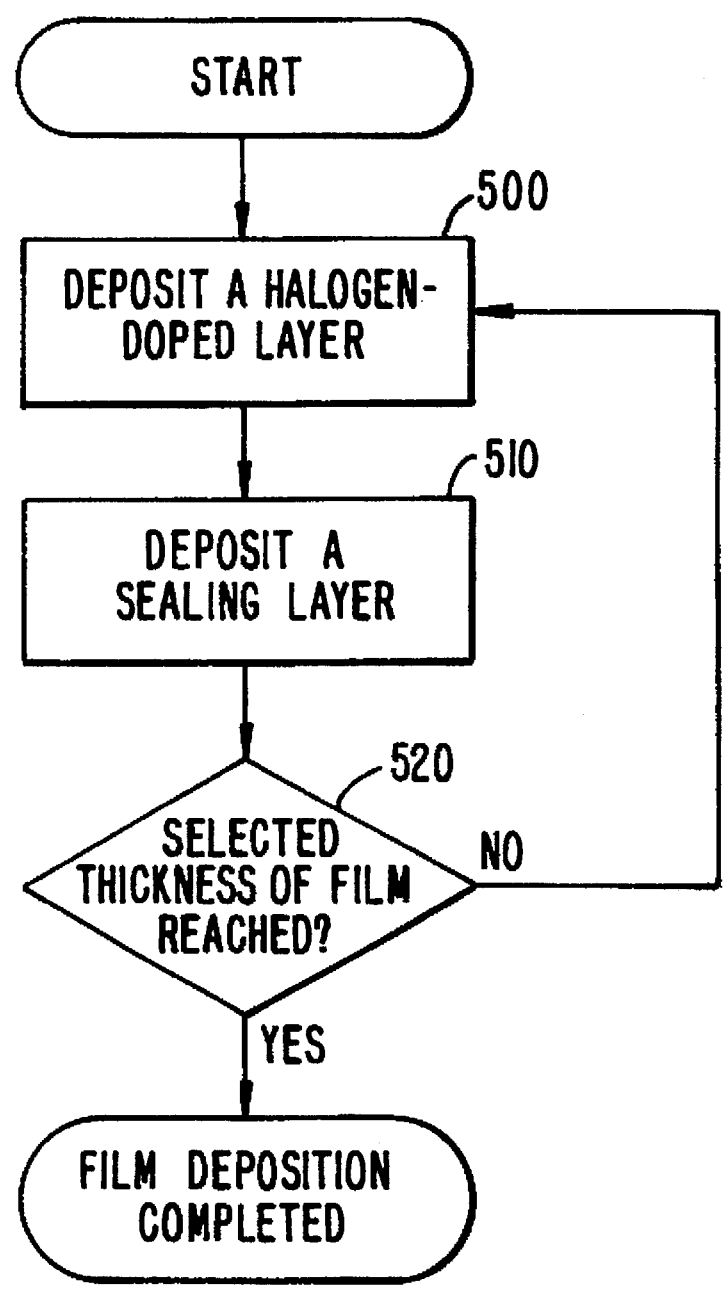
FIG. 5 is a flowchart illustrating steps undertaken in formation of bulk and sealing layers deposited in the film shown in FIG. 2A according to the process of the present invention.

One method used to create the multi-layered structure of the present invention shown in FIG. 2A is illustrated in the flowchart of FIG. 5. At step 500, halogen-doped bulk layer 120 is deposited. At step 510, sealing layer 170 is deposited. This two-step process is repeated until the selected film thickness is reached, alternately depositing bulk layers 120–160 and sealing layers 170–210 (step 520). For example, in a process that deposits a fluorine-doped silicon oxide film, a sealing layer will typically be between about 100 Å to 500 Å in thickness, and preferably between about 100 Å to 150 Å in thickness, depending on the desired film properties. Such layers could be deposited every 2000 Å for a total of 5 doped-layer/undoped-layer pairs in a film approximately 1.05 µm thick. Thicker or thinner sealing layers are possible, but for each different process there is a point at which the characteristics of the deposited film no longer approximate those of a halogen-doped silicon oxide layer.

Each sealing layer may be created, for example, by depositing a carbon-rich material or a halogen-lean (e.g., undoped silicon oxide) material. Carbon-rich layers may be created, for example, by introducing a carbon-containing gas in the process gas initially and subsequently interrupting the flow of the oxygen- and silicon-containing source gases to deposit the carbon-rich layer. Alternatively, a carbon-containing source gas may be introduced at the time the carbon-rich layer is to be deposited, while interrupting the flow of the oxygen- and silicon-containing source gases. A halogen-lean sealing layer may be created by interrupting the flow of the halogen-containing source gas. The creation of sealing layers by each of these methods is described below.

Figure 6:
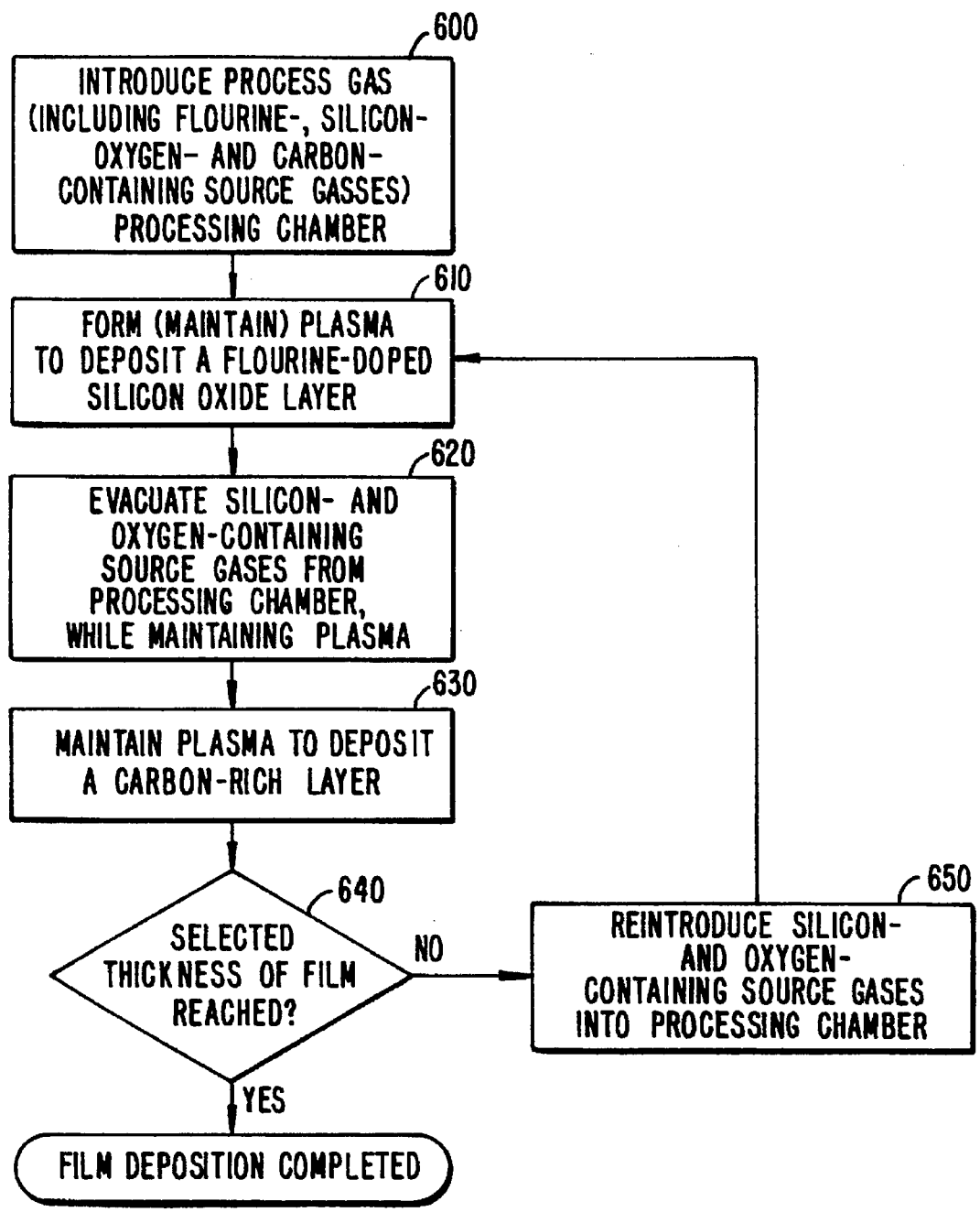
FIG. 6 is a flowchart illustrating steps undertaken in formation of the multi-layered film shown in FIG. 2A according to a first embodiment of the process of the present invention.

A. Creating a Fill According to the Present Invention by Maintaining a Carbon-Containing Process Gas in the Processing Chamber Environment In a preferred embodiment, the bulk layers are fluorine-doped silicon oxide and the sealing layers are carbon-rich layers. A carbon-rich layer may be created by reducing the amount of silicon and oxygen source gases present in vacuum chamber 10 during the sealing layers' deposition. This increase in the proportion of carbon contained in the process gas increases the amount of carbon in the layer deposited. FIG. 6 illustrates this process with reference to the apparatus as shown in FIG. 1A. The process begins by loading a substrate (not shown) into vacuum chamber 10 through a vacuum-lock door (not shown) under the control of a computer program stored in a computer readable storage medium such as memory 33 and executed by system controller 31. The substrate is then placed onto pedestal 44 and a process gas is introduced into vacuum chamber 10 via gas injection nozzles 14 (FIG. 6, step 600).

The process gas is a gaseous mixture including fluorine, silicon, oxygen and carbon. Such a process gas can be provided, for example, by the introduction of carbon tetrafluoride ($CF_4$), silane ($SiH_4$), oxygen ($O_2$) and methane ($CH_4$). An inert gas such as argon may also be included to enhance sputtering of the film when deposited in an HDP-CVD system such as exemplary HDP-CVD system shown in FIG. 1A.

A plasma is formed from the process gas in step 610 to deposit an FSG bulk layer. At step 620, system controller 31 then causes the control valves to interrupt the flow of silicon and oxygen source gases, while maintaining the plasma and the flow of the other source gases, causing the deposition of a carbon-rich layer (step 630). If the requisite thickness has not yet been reached (step 640), the flow of silicon and oxygen source gases is then re-established at step 650 to deposit an FSG layer over the just-deposited carbon-rich layer. This deposition of alternating fluorine-doped silicon oxide and carbon-rich layers continues until the film reaches the requisite thickness.

When the process gas is a mixture of $CF_4$, $SiH_4$, $O_2$, $CH_4$, and argon gas introduction rates for deposition of the FSG bulk layers are as follows. Silane is introduced into vacuum chamber 10 at a rate of between about 5 sccm and 120 sccm, and most preferably at a rate of about 60 sccm. Oxygen is introduced into the chamber at a rate of between about 10 sccm and 200 sccm, and most preferably at a rate of about 96 sccm. Methane is introduced into vacuum chamber 10 at a rate of between about 4 sccm and 100 sccm, and most preferably at a rate of about 40 sccm. Fluorine is introduced into vacuum chamber 10 at a rate of between about 5 sccm and 80 sccm, and most preferably at a rate of about 38 sccm. Argon is introduced at a rate of between about 2 sccm and 50 sccm, and most preferably at a rate of about 20 sccm.

The introduction of silane and oxygen is stopped during deposition of the carbon-rich sealing layers. Alternatively, the introduction rate of silane and oxygen can be reduced to minimal flow rates such as between 5–10 sccm. The total gas flow into vacuum chamber 10 through gas injection nozzles 14 for deposition of the FSG bulk and carbon-rich sealing layer is between about 20 sccm and 400 sccm. These flow rates are based on the use of a Centura HDP-CVD deposition system manufactured by Applied Materials, Inc., and will vary with the type of system and the volume of the vacuum chamber used as described in more detail below.

A selected pressure between about 1 millitorr and 100 millitorr (preferably about 2 millitorr and 20 millitorr, and most preferably between about 2 millitorr and 3 millitorr) in vacuum chamber 10 is maintained throughout deposition by throttle valve 12a in conjunction with vacuum pump 12, and the introduction of the process gas. Also, the temperature within chamber 10 and maintained at between 250° and 450° C. (preferably between about 350° and 400° C.).

After other processing conditions are set, RF energy is applied to coiled antenna 26 by SRF generator 32. SRF generator 32 is driven at a frequency of 2 MHz at between about 200 Watts and 7000 Watts, but preferably at about 3500 Watts. The plasma is biased toward the substrate and further excited by capacitively coupling RF energy from BRF generators 36 and 50 to ceiling electrode 24 and pedestal 44. BRF generators 36 and 50 are driven at frequency of 1.8 MHz at between about 200 Watts and 7000 Watts, but preferably at about 2500 Watts. The power densities at the substrate surface are preferably between about 5 W/cm$^2$ and 15 W/cm$^2$. BRF generators 36 and 50 may also be driven at a frequency of 13.56 MHz. SRF generator 32 and BRF generators 36 and 50 may also be operated at other frequencies and power levels to deposit a film according to the present invention.

In addition to process gas sequencing, the carbon-rich material's characteristics may be altered, for example, by altering the sequencing of SRF and BRF power sources in the exemplary HDP-CVD process. The thickness of a carbon-rich layer may also be determined, for example, by varying the duration for which the oxygen and silicon source gases are interrupted. Preferably, the oxygen and silicon gases are interrupted for between about 10 seconds. The rate at which the oxygen and silicon sources are shut down is also important. The shorter the duration of the transition period, the faster the transition between the halogen-doped sealing layer and the carbon-rich layer. This is important because it is believed that a substantially smooth transition zone between each of the layers is desirable, due to the possible mechanical stress created by mismatch between the layers at an interface having a rapid transition.

Figure 7:
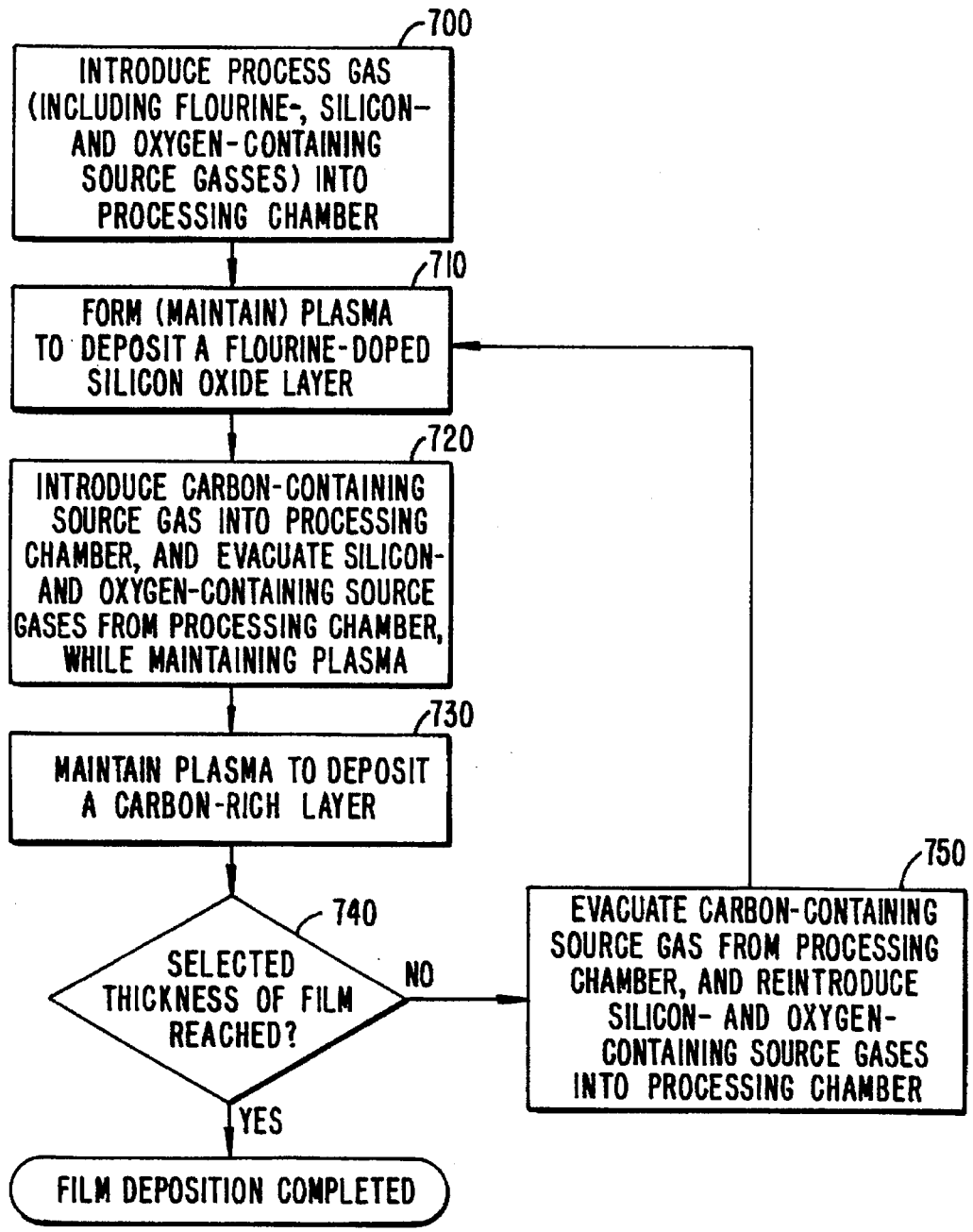
FIG. 7 is a flowchart illustrating steps undertaken in formation of the multi-layered film shown in FIG. 2A according to a second embodiment of the process of the present invention.

B. Creating a Film According to the Present Invention by Introducing a Carbon-Containing Process Gas into the Processing Chamber Environment In another preferred embodiment that includes alternating FSG bulk and carbon-rich sealing layers, the carbon-rich sealing layers may be created by reducing the amount of silicon and oxygen source gases and introducing a carbon source gas. FIG. 7 illustrates this process with cross-reference numerals to the apparatus as shown in FIG. 1A. To form a sealed, halogen-doped film in this manner, a substrate (not shown) is loaded into vacuum chamber 10 through a vacuum-lock door (not shown) under the control of a computer program stored in a computer readable storage medium such as memory 33 and executed by system controller 31. The substrate is then placed onto pedestal 44, and system controller 31 causes the control valves to introduce one or more process gases into vacuum chamber 10 via gas injection nozzles 14 (FIG. 7, step 700). In this embodiment, the process gas is a gaseous mixture including fluorine, silicon and oxygen. The process gas does not normally include carbon. An inert gas such as argon may be included to enhance sputtering as described above.

A plasma is formed from the process gas to deposit an FSG bulk layer (step 710). System controller 31 then causes the control valves to interrupt or reduce the flow of the silicon and oxygen source gases, while maintaining the plasma and the flow of the other source gases. At about this time, system controller 31 also causes the control valves to introduce a carbon source gas (e.g., methane into vacuum chamber 10 (step 720) to effect deposition of a carbon-rich sealing layer (step 730). If the requisite thickness has not yet been reached (step 740), the flow of the silicon and oxygen source gases is re-established, and the flow of the carbon source gas interrupted to continue the deposition process (step 750). The alternating deposition of fluorine-doped silicon oxide layers and carbon-rich layers is repeated until the film reaches the requisite thickness.

When the process gas is a mixture of silane, oxygen, fluorine and argon gas introduction rates are as follows to deposit the FSG bulk layer. Silane is introduced into vacuum chamber 10 at a rate of between about 5 sccm and 120 sccm, and most preferably at a rate of about 60 sccm. Oxygen is introduced into the chamber at a rate of between about 10 sccm and 200 sccm, and most preferably at a rate of about 96 sccm. Fluorine is introduced into vacuum chamber 10 at a rate of between about 5 sccm and 80 sccm, and most preferably at a rate of about 38 sccm. Argon is introduced at a rate of between about 2 sccm and 50 sccm, and most preferably at a rate of about 20 sccm.

To deposit the sealing layers, a carbon-containing gas such as methane is subsequently introduced into vacuum chamber 10 at a rate of between about 4 sccm and 100 sccm, and most preferably at a rate of about 40 sccm. At about this time, the introduction of silane and oxygen can either be stopped or reduced to minimal levels (e.g., about 5–10 sccm). The total gas flow into vacuum chamber 10 through gas injection nozzles 14 is between about 20 sccm and 400 sccm. These flow rates are based on the use of a Centura HDP-CVD deposition system manufactured by Applied Materials, Inc., and will vary with the type of system and the volume of the vacuum chamber used.

A selected pressure between about 1 millitorr and 100 millitorr (preferably about 2 millitorr and 20 millitorr, and most preferably between about 2 millitorr and 3 millitorr) in vacuum chamber 10 is maintained throughout deposition by throttle valve 12a in conjunction with vacuum pump 12, and the introduction of the process gas. Also, the temperature within chamber 10 and maintained at between 250° C. and 450° C. (preferably between about 350° C. and 400° C.).

After other processing conditions are set, RF energy is applied to coiled antenna 26 by SRF generator 32. SRF generator 32 is driven at a frequency of 2 MHz at between about 200 Watts and 7000 Watts, but preferably at about 3500 Watts. The plasma is biased toward the substrate and further excited by capacitively coupling RF energy from BRF generators 36 and 50 to ceiling electrode 24 and pedestal 44. BRF generators 36 and 50 are driven at a frequency of 1.8 MHz at between about 200 Watts and 7000 Watts, but preferably at about 2500 Watts. The power densities at the substrate surface are preferably between about 5 W/cm$^2$ and 15 W/cm$^2$. BRF generators 36 and 50 may also be driven at a frequency of 13.56 MHz. SRF generator 32 and BRF generators 36 and 50 may also be operated at other frequencies and power levels to deposit a film according to the present invention.

While the comments regarding the previous method of depositing carbon-rich sealing layers apply equally to this method, an additional degree of freedom exists here, as system controller 31 may cause the control valves to introduce the carbon source gas before, during or after the period when the flow of the silicon and oxygen source gases is interrupted. Thus, this embodiment provides greater control over the rate at which the transition between bulk and sealing layers occurs.

C. Creating a Film According to the Present Invention by Removing the Halogen-Containing Source Gas from the Processing Chamber Environment In yet another embodiment, the process of the present invention alternates between depositing fluorine-doped silicon oxide bulk layers and undoped silicon oxide sealing layers. In this embodiment, a sealing layer is deposited by temporarily reducing or stopping the introduction of fluorine into the chamber. This results in alternating layers of thicker, fluorine-rich (doped) silicon oxide and thinner, fluorine-lean (undoped) silicon oxide.

Figure 8:
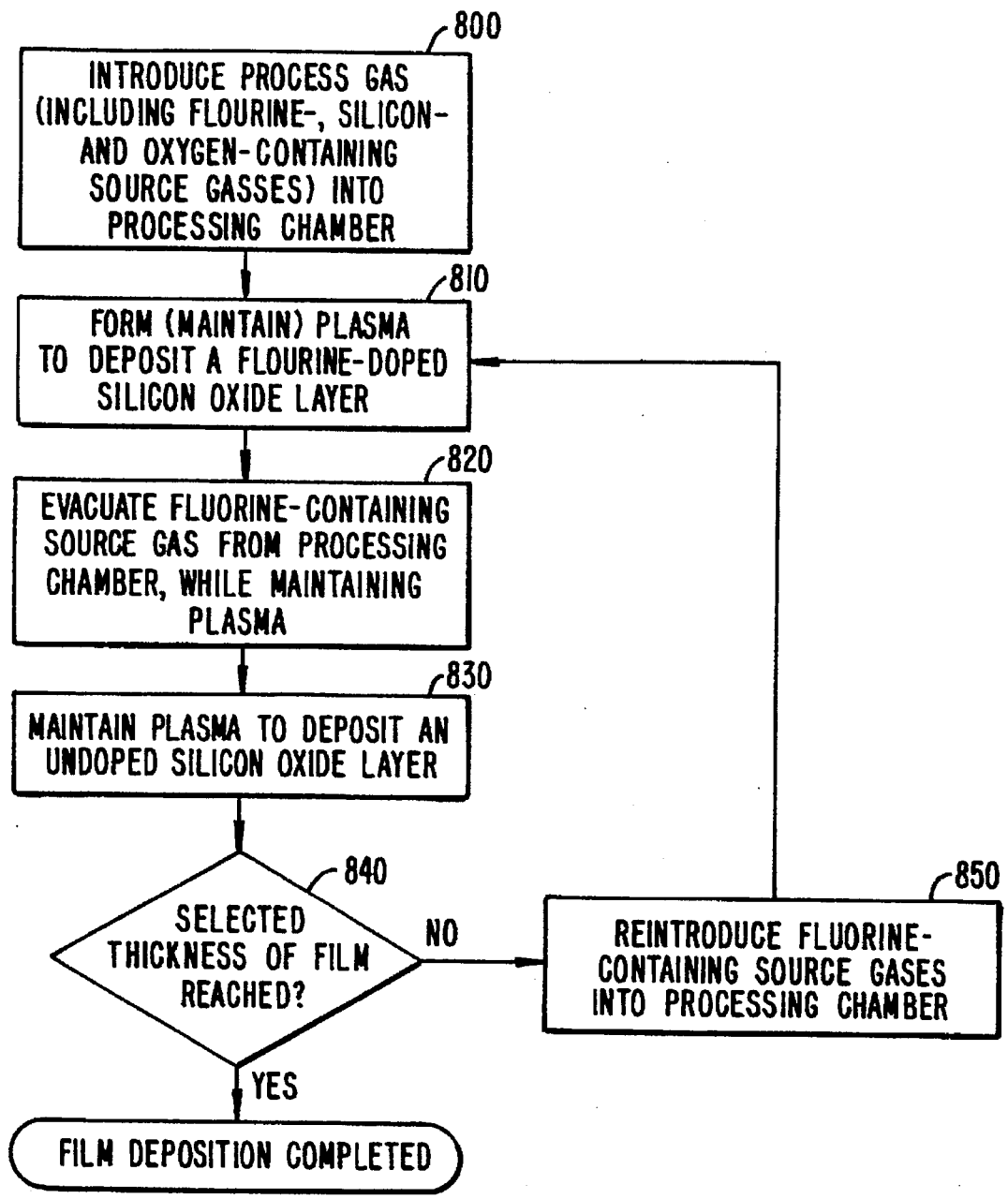
FIG. 8 is a flowchart illustrating steps undertaken in formation of the multi-layered film shown in FIG. 2A according to a third embodiment of the process of the present invention.

FIG. 8 illustrates this process with cross-reference numerals to the apparatus as shown in FIG. 1A. To form the sealing and bulk layers in this manner, the substrate is loaded into vacuum chamber 10 through a vacuum-lock door (not shown), placed onto pedestal 44, and one or more process gases introduced into vacuum chamber 10 via gas injection nozzles 14 (FIG. 8, step 800) under the control of system controller 31. In this embodiment, the process gas is a gaseous mixture including fluorine, silicon and oxygen.

Additionally, an inert gas such as argon may also be included to enhance sputtering as previously described. A plasma is formed at step 810 which causes the deposition of a fluorine-doped silicon oxide bulk layer. At step 820, system controller 31 then causes the control valves to interrupt or reduce the flow of the fluorine source gas, while maintaining the plasma and the flow of the other source gases to deposit an undoped sealing layer (step 830). This deposition of alternating fluorine-doped silicon oxide and undoped silicon oxide layers continues until the film reaches the requisite thickness (step 840). If the requisite thickness has not yet been reached, the flow of the fluorine source gas is then re-established at step 850 to continue the deposition process.

In this embodiment, the process gas may be a mixture of silane, oxygen, fluorine and argon or a similar gas as an additional constituent. In a preferred embodiment, silane is introduced into vacuum chamber 10 at a rate of between about 5 sccm and 120 sccm, and most preferably at a rate of about 60 sccm; oxygen is introduced into the chamber at a rate of between about 10 sccm and 200 sccm, and most preferably at a rate of about 96 sccm; fluorine is introduced into vacuum chamber 10 at a rate of between about 5 sccm and 80 sccm, and most preferably at a rate of about 40 sccm; and argon is introduced at a rate of between about 2 sccm and 50 sccm, and most preferably at a rate of about 20 sccm to deposit the FSG bulk layers. During deposition of the sealing layers, the introduction of $F_2$ can either be stopped or reduced to a minimal flow rate of between, for example, 5–10 sccm. The total gas flow into vacuum chamber 10 through gas injection nozzles 14 is between about 20 sccm and 400 sccm. Similar to the embodiments described above, these flow rates are based on the use of a Centura HDP-CVD deposition system manufactured by Applied Materials, Inc. and will vary with other chambers of different design and/or volume.

A selected pressure between about 1 millitorr and 100 millitorr (preferably about 2 millitorr and 20 millitorr, and most preferably between about 2 millitorr and 3 millitorr) in vacuum chamber 10 is maintained throughout deposition by throttle valve 12a in conjunction with vacuum pump 12, and the introduction of the process gas. Also, the temperature within chamber 10 and maintained at between 250° C. and 450° C. (preferably between about 350° C. and 400° C.).

After other processing conditions are set, RF energy is applied to coiled antenna 26 by SRF generator 32. SRF generator 32 is driven at a frequency of 2 MHz at between about 200 Watts and 7000 Watts, but preferably at about 3500 Watts. The plasma is biased toward the substrate and further excited by capacitively coupling RF energy from BRF generators 36 and 50 to ceiling electrode 24 and pedestal 44. BRF generators 36 and 50 are driven at a frequency of 1.8 MHz at between about 200 Watts and 7000 Watts, but preferably at about 2500 Watts. The power densities at the substrate surface are preferably between about 5 W/cm$^2$ and 15 W/cm$^2$. BRF generators 36 and 50 may also be driven at a frequency of 13.56 MHz. SRF generator 32 and BRF generators 36 and 50 may also be operated at other frequencies and power levels to deposit a film according to the present invention.

In each of the foregoing embodiments, the gas introduction rates are given for a Centura HDP-CVD deposition system manufactured by Applied Materials, Inc., outfitted to process 8-inch substrates. These rates depend in part on chamber design and chamber volume among other factors. Thus, the actual introduction rates employed in other embodiments employing other deposition chambers may vary. Also, while most of the described embodiments included FSG bulk layers, other halogen-doped layers may be deposited instead. Also, gases other than those specifically discussed can be employed. For example, fluorine can be provided by $CF_4$, $F_2$, $C_2F_6$, $SiF_4$ or similar sources; silicon by $O_3$, $N_2O$ or similar sources; silicon by tetramethyl silane ($Si(CH_3)_4$), hexamethyl disiloxane (($CH_3)_6OSi_2$), TEOS ($Si(OC_2H_5)_4$) or the like; and carbon $C_2F_6$, $C_2H_6$ or the like. The present invention is not intended to be limited to any particular set of deposition gases. Furthermore, the parameters listed in the above process should not be viewed as limiting the claims as described herein. Other chemicals, environmental parameters and conditions may be used to create a structure according to the method of the present invention.

III. Exemplary Structure

Figure 9:
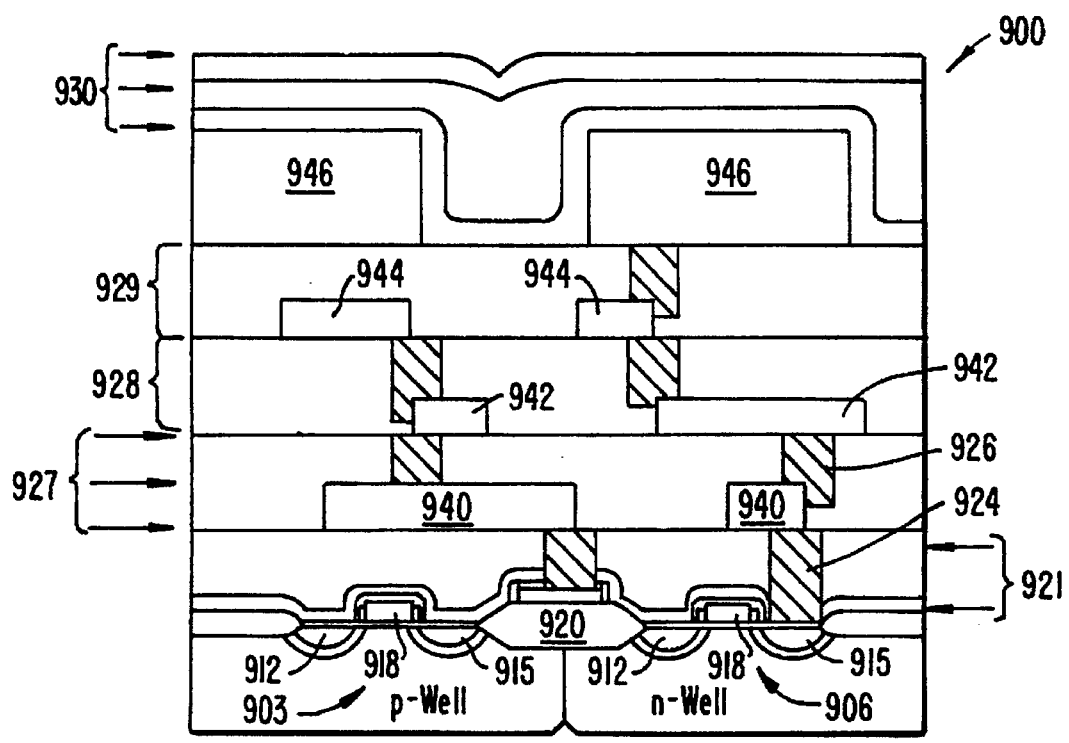
FIG. 9 is a simplified cross-sectional view of an integrated circuit that includes the multi-layered film of the present invention.

Shown in FIG. 9 is a simplified cross-sectional view of an exemplary CMOS integrated circuit 900 which may employ the present invention. As shown, integrated circuit 900 includes NMOS and PMOS transistors 903 and 906, which are separated and electrically isolated from each other by a field oxide region 920. Each transistor 903 and 906 comprises a source region 912, a drain region 915 and a gate region 918. A premetal dielectric (PMD) layer 921 separates transistors 903 and 906 from metal layer 940, with connections between metal layer 940 and the transistors made by contacts 924. Metal layer 940 is one of four metal layers, 940–946, included in exemplary integrated circuit 900. Each metal layer 940–946 is separated from adjacent metal layers by respective intermetal dielectric layers 927, 928 or 929. Adjacent metal layers are connected at selected openings by vias 926. Deposited over metal layer 946 are planarized passivation layers 930.

While the halogen-doped film of the present invention may find uses in several of the layers shown in integrated circuit 900, its physical properties make it most useful for use as intermetal dielectric layers 927–929. It should be understood that the simplified integrated circuit 900 is for illustrative purposes only. One of ordinary skill in the art could implement the present invention in the fabrication of other integrated circuits such as microprocessors, application-specific integrated circuits (ASICs), memory devices and the like. The present invention may also be implemented in the fabrication of integrated circuits using technologies such as BiCMOS, NMOS, bipolar, and others.

IV. Experimental Results

Experiments were performed to demonstrate the effectiveness of a carbon-rich sealing layer created according to the method of the present invention. In these experiments, a carbon-rich sealing layer was deposited over a fluorine-doped silicon oxide (i.e., fluoro-silicate glass or FSG) film in an Applied Materials Centura HDP-CVD deposition system configured to process 8-inch substrates. The FSG film was deposited by introducing process gasses including silane ($SiH_4$), carbon tetrafluoride ($CF_4$), oxygen ($O_2$) and argon (Ar) into the deposition system's vacuum chamber. Gas flow was maintained throughout the deposition of the FSG film. At the end of this deposition step, gas flow was discontinued and the bias RF supply switched off. Because the residence time of $SiH_4$ is shorter than that of $CF_4$, the atmosphere in the chamber became $SiH_4$-lean and $CF_4$-rich upon the discontinuation of gas flow. This resulted in the subsequent formation of a carbon-rich sealing layer over the deposited FSG film.

Process gas flowrates used in the deposition of the FSG film were as follows. Oxygen was introduced into the vacuum chamber at a flowrate of about 96 sccm. The flowrate of silane into the vacuum chamber was about 60 sccm. The carbon tetrafluoride flowrate was about 38 sccm and the argon flowrate was about 20 sccm. Bias RF power was set to about 2000 Watts. Source RF power during the deposition of the FSG film and carbon-rich sealing layer was set to about 3000 Watts. To test the effectiveness of a carbon-rich sealing layer, several substrates were coated with the FSG/carbon-rich sealing layer combination. The carbon-rich layer was then removed from some of the substrates by etching away the deposited film in an $O_2$/Ar atmosphere. This allowed a comparison between FSG films having a sealing layer and those without, thus exemplifying the carbon-rich sealing layer's benefits.

Figure 10:
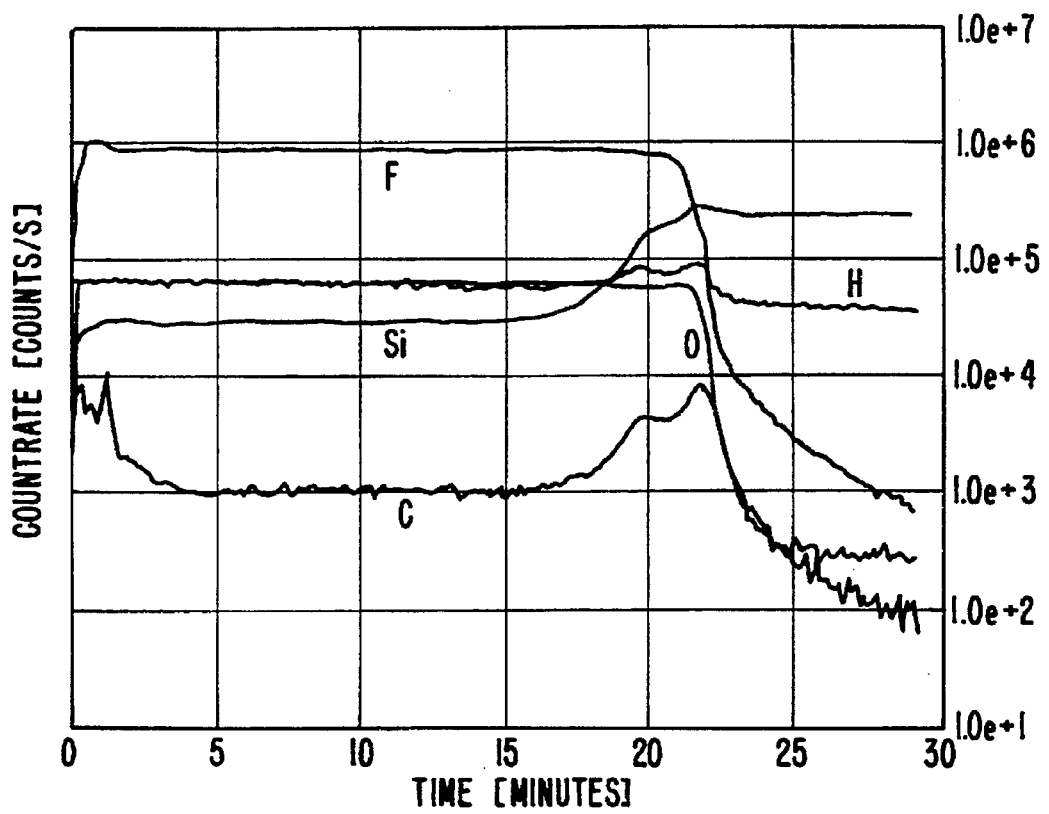
FIG. 10 is a graph of a depth profile for a film deposited according to the method of the present invention.

FIG. 10 illustrates a depth profile of an FSG film having a carbon-rich sealing layer. A depth profile showing the concentration (in counts/second) of the various constituents of the film and process gasses used in etching the film in the system's vacuum chamber at various points in time. A film's composition is determined using this method by examining the gaseous by-products generated as the film is etched away. These concentrations are measured in terms of time because the concentration measured at any one time reflects the film's composition at that depth. Thus, the longer the period of time, the greater the depth into the film a given concentration represents. While relative layer position and composition may be determined, film thicknesses are difficult to accurately estimate using this method. This is due to variations in the etch rates exhibited by different material compositions and the difficulty in determining exact process parameters.

As seen in FIG. 10, the traces show the depletion of silicon and a high carbon content close to the film surface, indicating that a carbon-rich sealing layer was successfully deposited by the previously described method. In these tests, the total film thickness was on the order of about 8000 Å. The carbon-rich sealing layer constituted between about 300 Å and 500 Å of this thickness. As demonstrated in the following figures, this sealing layer proved effective in protecting the underlying FSG layer.

Figure 11A:
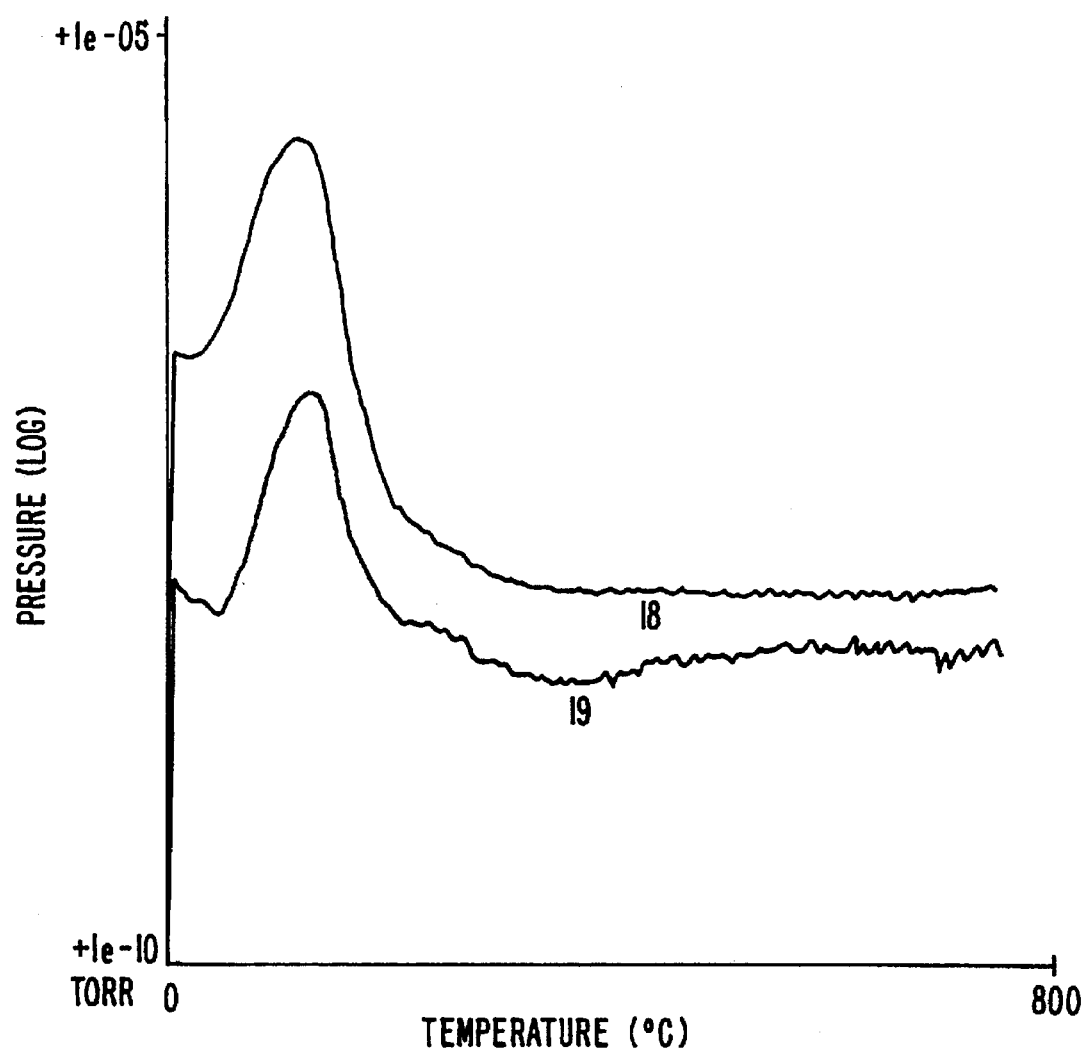
FIG. 11A is a thermal desorption spectroscopy (TDS) scan for a sealed FSG film deposited according to the method of the present invention, made after etching away its carbon-rich sealing layer.
Figure 11B:
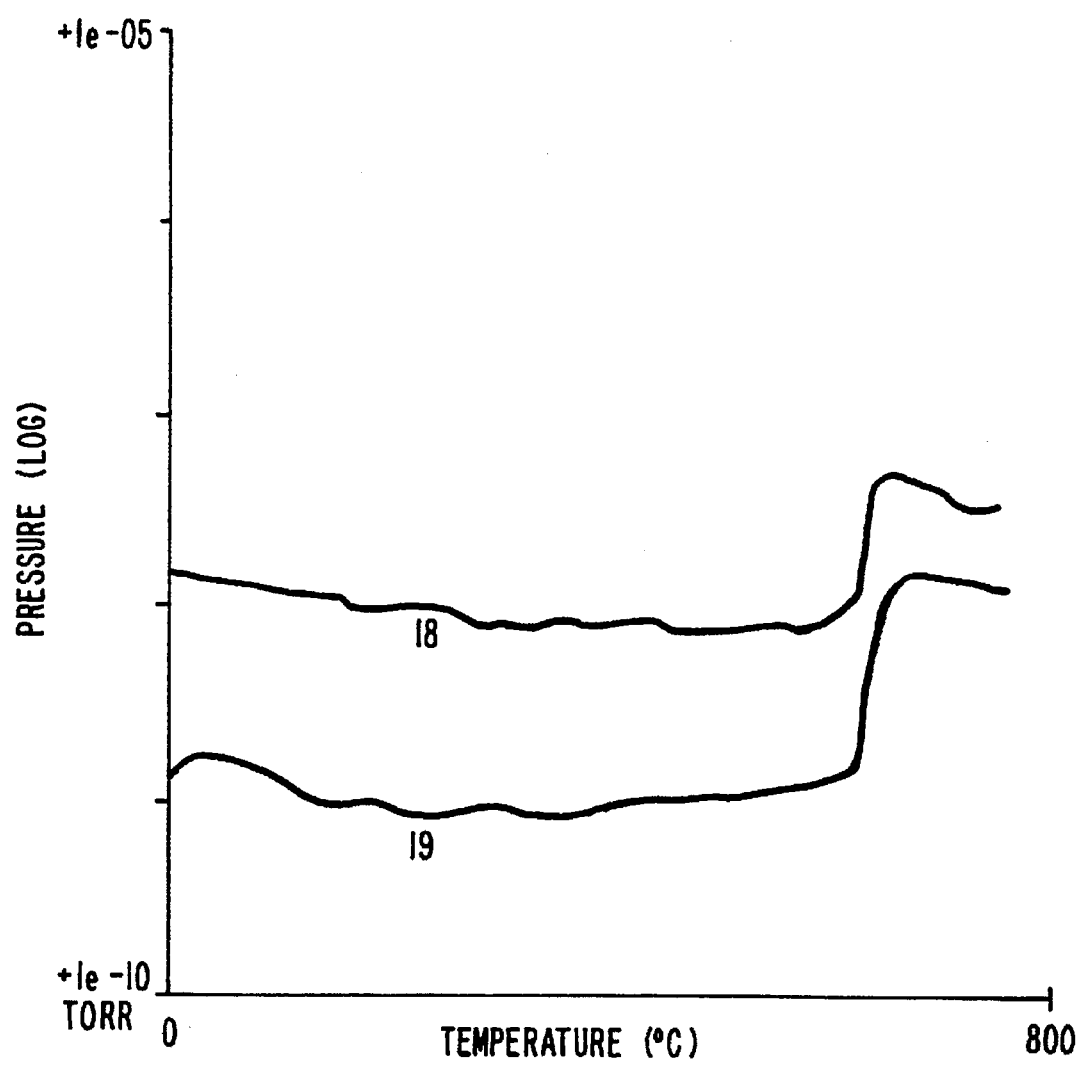
FIG. 11B is a TDS scan for a sealed FSG film deposited according to the method of the present invention, made with a carbon-rich sealing layer in place.

FIGS. 11A and 11B show thermal desorption spectroscopy (TDS) scans. Such scans indicate the release of various chemicals as a function of temperature to which a sample is heated. With regard to a fluorine-doped film, absorbed $H_2O$ is evidenced in such a test by the desorption (i.e., release) of both unreacted $H_2O$ (as $H_2O$) and reacted $H_2O$ (as HF, the product of $H_2O$ reacting with fluorine). As previously noted, the reaction of $H_2O$ with fluorine neutralizes the advantageous effects provided by fluorine doping.

FIG. 11A shows the results of heating a sealed FSG film after etching away its carbon-rich sealing layer, as previously described. The sample was kept in a controlled ambient atmosphere of 20° C. and 50% relative humidity for 24 hours after the removal of the sealing layer. The TDS scan was subsequently performed. Peaks indicating $H_2O$ (plot #18) and HF (plot #19) desorption can be seen at around 100° C. in the plots shown in FIG. 11A. This indicates that the unsealed film experienced water absorption during exposure to the ambient atmosphere. Certain of the preferred characteristics of the FSG may thus be presumed degraded.

FIG. 11B illustrates a TDS scan of a sealed FSG film with the carbon-rich sealing layer in place. Again, the sample was exposed to a controlled ambient atmosphere of 20° C. and 50% relative humidity for 24 hours. No thermally desorbed $H_2O$ is evident in the plot shown in FIG. 11B, up to a temperature of about 600° C. This indicates that the sealed film experienced minimal water absorption during exposure to the ambient atmosphere, and thus the carbon-rich sealing layer was successful at protecting the underlying FSG film from ambient moisture.

Figure 12A:
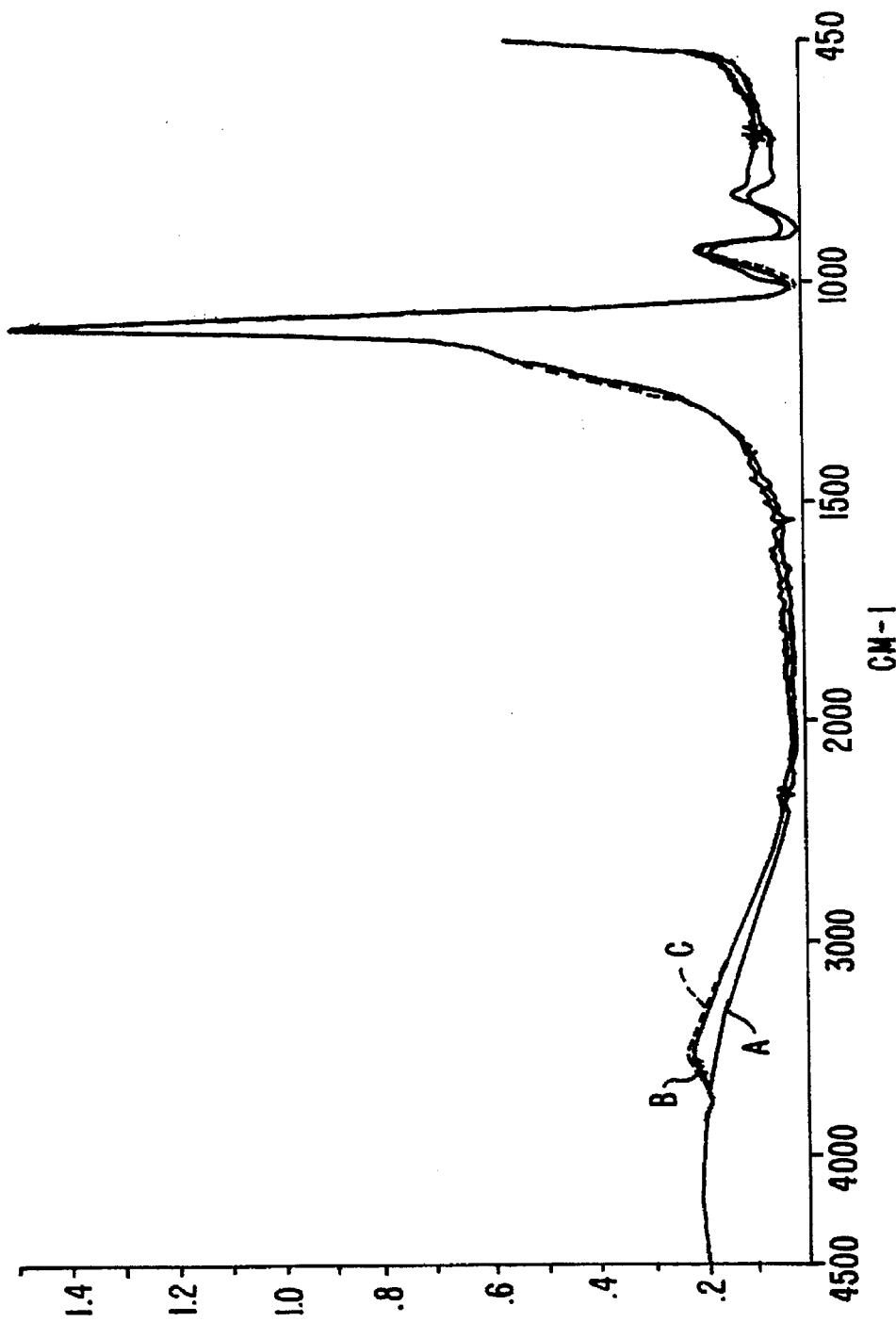
FIG. 12A is a Fourier-transformed infrared (FTIR) spectrum for a sealed FSG film deposited according to the method of the present invention, made after etching away its carbon-rich sealing layer.
Figure 12B:
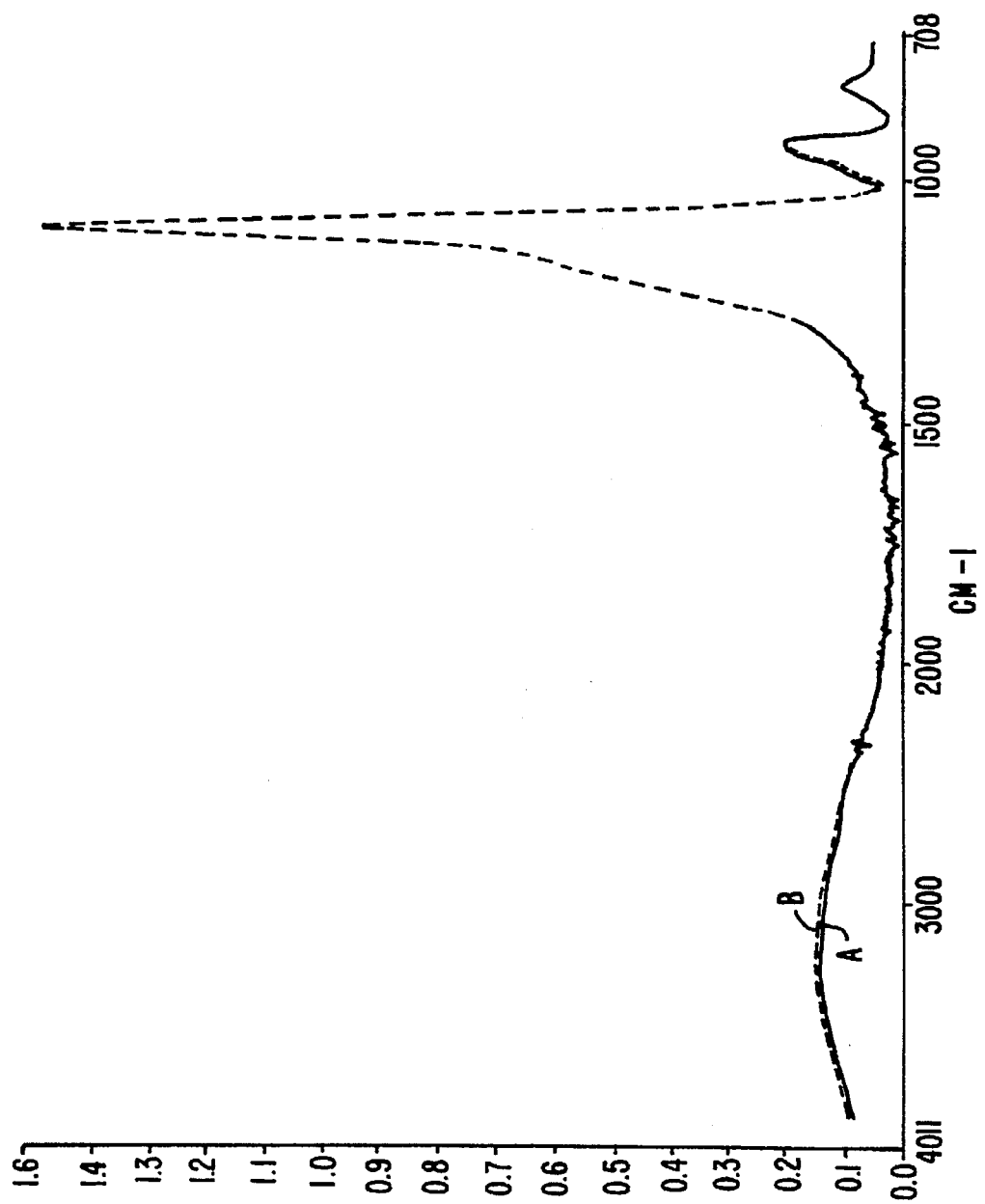
FIG. 12B is an FTIR spectrum for a sealed FSG film deposited according to the method of the present invention, made with a carbon-rich sealing layer in place.

FIGS. 12A and 12B illustrate Fourier-transformed infrared (FTIR) spectrums. Such spectral information is generated by measuring the infrared (IR) light reflected off a sample at various wavelengths (i.e., frequencies). Conversely, this technique can be viewed as measuring the amount of IR light absorbed at various wavelengths. Wavelengths at which absorption of the IR light peaks indicate the presence of certain chemicals.

FIG. 12A illustrates the FTIR of a sealed FSG film after the removal of the carbon-rich sealing layer. This exposed the remaining film, which was then subjected to a controlled ambient atmosphere (20° C. and 50% relative humidity). No $H_2O$ absorption is evident in etched samples exposed to the ambient for 15 minutes (plot A). However, moisture-induced absorption bands of Si-OH (around 3650 cm$^{-1}$) and H—OH (around 3400 cm$^{-1}$) can be observed in the plots generated for the etched samples exposed to the controlled ambient atmosphere for only 6 hours (plot B). Si—OH and H—OH are dissociation by-products of the absorbed $H_2O$, which dissociates into a hydroxyl group (OH) and a hydrogen (H). The hydrogen then either persists in the film, unreacted or combines with Si. After 21 hours of exposure (plot C), little more $H_2O$ absorption is evident than in the plot for samples exposed for 6 hours. These plots again indicate that an unprotected FSG layer will suffer from $H_2O$ absorption.

FIG. 12B illustrates an FTIR spectrum of a sealed FSG film with its carbon-rich sealing layer in place. As is evident from the figure, none of the previously described moisture-induced bands were detected. This indicates that the carbon-rich sealing layer again minimized water absorption in the FSG film.

The preceding tests were performed using an sealed FSG film having a single carbon-rich sealing layer. As the above experiments indicate, the carbon-rich layer successfully minimized water absorption in the underlying FSG layer. Also illustrated by these examples is the utility of multiple sealing layers. As previously described, if a sealed film is to be partially eroded during subsequent processing, protection may be maintained by proper sequencing of the silicon- and carbon-containing process gas flows. By forming multiple sealing layers, alternated with halogen-doped silicon oxide layers, the protection such sealing layers afford may be retained despite subsequent processing. Further protection may be provided during such processing by increasing sealing layer thickness.

The method of the present invention is not intended to be limited by the specific parameters described in the various embodiments or set forth in the above experiments. Different processing conditions and different reactant sources can be used without departing from the spirit of the invention. Other equivalent or alternative methods of depositing a halogen-doped film having multiple sealing layers according to the present invention will be apparent to those skilled in the art. These equivalents and alternatives are intended to be included within the scope of the present invention.

What is claimed is:

1. A process for depositing a an interlevel dielectric film on a substrate disposed in a processing chamber, said process comprising the steps of:
   (a) depositing a first layer of said film from a process gas that includes silicon, oxygen and a halogen element;
   (b) depositing a second layer of said film over said first layer to reduce migration of said halogen element out of said first layer; and
   (c) repeating steps (a) and (b) at least until said film reaches a selected-thickness.

2. The process of claim 1 wherein said first depositing step is performed in a first substrate processing chamber and said second depositing step is performed in a second substrate processing chamber.

3. The process of claim 1 wherein said process gas further includes carbon.

4. The process of claim 3 wherein the first and second depositing steps are performed in the same processing chamber and wherein said second depositing step comprises temporarily removing said silicon and said oxygen from said process gas.

5. The process of claim 4 wherein said halogen element is fluorine.

6. The process of claim 4 wherein said second layer is deposited to a thickness of between about 5 to 20 percent of the thickness to which said first layer is deposited.

7. The process of claim 4 further comprising the step of depositing a carbon-rich underlayer under said first layer to reduce migration of said halogen element out of said first layer.

8. The process of claim 4 wherein a plasma is maintained throughout said first and said second depositing steps, said plasma causing the deposition of said first and said second layers.

9. The process of claim 8 wherein said halogen element is fluorine.

10. The process of claim 9 wherein said first layer of said film is a fluorine-doped silicon oxide layer, and said second layer of said film is a carbon-rich layer.

11. The process of claim 10 wherein said film is deposited at a temperature of between about 250°–450° C.

12. The process of claim 10 wherein said film is deposited at a pressure of between about 1–100 millitorr.

13. The process of claim 10 wherein said film is deposited at a temperature of between about 350°–400° C. and at a pressure of between about 2–20 millitorr.

14. The process of claim 10 wherein said film is deposited using a plasma density of between about 5 W/cm$^2$ and 15 W/cm$^2$.

15. The process of claim 1 wherein the first and second depositing steps are performed in the same processing chamber and wherein said second depositing step comprises temporarily removing said halogen element from said process gas.

16. The process of claim 15 wherein a plasma is maintained throughout said first and said second depositing steps, said plasma causing the deposition of said first and said second layers.

17. The process of claim 16 wherein said halogen element is fluorine.

18. The process of claim 17 wherein said first layer of said film is a fluorine-doped silicon oxide layer, and said second layer of said film is an undoped silicon oxide layer.

19. The process of claim 18 wherein said film is deposited at a temperature of between about 250°–450° C.

20. The process of claim 18 wherein said film is deposited at a pressure of between about 1–100 millitorr.

21. The process of claim 18 wherein said film is deposited at a temperature of between about 350°–400° C. and at a pressure of between about 2–20 millitorr.

22. The process of claims 18 wherein said film is deposited using plasma density of between about 5 W/cm$^2$ and 15 W/cm$^2$.

23. The process of claim 1 wherein the first and second depositing steps are performed in the same processing chamber and wherein said second depositing step comprises the steps of:
   introducing carbon into said process gas temporarily; and
   removing said oxygen and said silicon from said process gas temporarily.

24. The process of claim 23 wherein said halogen element is fluorine.

25. The process of claim 23 wherein said second layer is deposited to a thickness of between about 5 to 20 percent of the thickness to which said first layer is deposited.

26. The process of claim 23 further comprising the step of depositing a carbon-rich underlayer under said first layer to reduce migration of said halogen element out of said first.

27. The process of claim 23 wherein a plasma is maintained throughout said first and said second depositing steps, said plasma causing the deposition of said first and said second layers.

28. The process of claim 27 wherein said halogen element is fluorine.

29. The process of claim 28 wherein said first layer of said film is a fluorine-doped silicon oxide layer, and said second layer of said film is a carbon-rich layer.

30. The process of claim 29 wherein said film is deposited at a temperature of between about 250°–450° C.

31. The process of claim 29 wherein said film is deposited at a pressure of between about 1–100 millitorr.

32. The process of claim 29 wherein said film is deposited at a temperature of between about 350°–400° C. and at a pressure of between about 2–20 millitorr.

33. The process of claim 29 wherein said film is deposited using a plasma density of between about 5 W/cm$^2$ and 15 W/cm$^2$.

34. The process of claim 15, wherein said second layer is deposited to a thickness of between about 5 to 20 percent of the thickness to which said first layer is deposited.

* * * * *